(12) United States Patent
Nishihara et al.

(10) Patent No.: US 8,618,804 B2
(45) Date of Patent: Dec. 31, 2013

(54) CHUCK MECHANISM OF CHARGE/DISCHARGE TESTING DEVICE FOR FLAT-RECHARGEABLE BATTERIES

(75) Inventors: Takashi Nishihara, Kawasaki (JP); Takahiro Kawasaki, Kawasaki (JP); Tsutomu Okazaki, Kawasaki (JP); Takeshi Yasooka, Yamato (JP); Hiroaki Habe, Hachioji (JP); Yoshikazu Niwa, Hadano (JP)

(73) Assignees: Fujitsu Telecom Networks Limited, Kanagawa (JP); Nissan Motor Co., Ltd., Kanagawa (JP)

( * ) Notice: Subject to any disclaimer, the term of this patent is extended or adjusted under 35 U.S.C. 154(b) by 265 days.

(21) Appl. No.: 13/161,928

(22) Filed: Jun. 16, 2011

(65) Prior Publication Data

US 2011/0309837 A1   Dec. 22, 2011

(30) Foreign Application Priority Data

Jun. 17, 2010   (JP) ................................ 2010-138189

(51) Int. Cl.
G01N 27/416   (2006.01)

(52) U.S. Cl.
USPC ........................................................ 324/426

(58) Field of Classification Search
None
See application file for complete search history.

(56) References Cited

U.S. PATENT DOCUMENTS

| 7,145,456 | B2 * | 12/2006 | Castle | 340/552 |
| 2011/0221384 | A1 * | 9/2011 | Scheucher | 320/101 |
| 2011/0254560 | A1 * | 10/2011 | Stone et al. | 324/427 |

FOREIGN PATENT DOCUMENTS

| DE | 32 07 545 C1 | 8/1983 |
| JP | 2000-058135 | 2/2000 |
| JP | 2002-134176 | 5/2002 |
| JP | 2003-151644 | 5/2003 |
| JP | 2004-319334 | 11/2004 |

OTHER PUBLICATIONS

Extended European Search Report dated Mar. 13, 2013 for European Application No. 11 00 4944.

* cited by examiner

Primary Examiner — Jermele M Hollington
Assistant Examiner — Trung Nguyen
(74) Attorney, Agent, or Firm — Antonelli, Terry, Stout & Kraus, LLP.

(57) ABSTRACT

The present invention relates to a chuck mechanism of a charge/discharge testing device for flat-rechargeable batteries and has a proposition to provide a chuck mechanism that makes it possible to lighten conventionally needed troublesome works, that is, for example, works of storing and fixing a large number of flat-rechargeable batteries in a container, and that is capable of surely chucking the flat-rechargeable batteries (electrodes). The chuck mechanism includes a first guide engageable with a battery pressing member of a battery storage which moves according to a battery storage width of a plurality of flat-rechargeable batteries stored in parallel in the battery storage, a plurality of chuck units arranged in parallel by being resiliently and continuously joined and having the first guide on one end side, and a second guide mounted on each of the chuck units, wherein a chuck width of all of the chuck units resiliently arranged in parallel is adjusted according to the battery storage width of the flat-rechargeable batteries by an engagement of the first guide and the battery pressing member, and the second guide positions each of the chuck units being adjusted according to the battery storage width with corresponding flat-rechargeable batteries in the battery storage.

7 Claims, 22 Drawing Sheets

CHUCK MECHANISM OF CHARGE/DISCHARGE TESTING DEVICE FOR FLAT-RECHARGEABLE BATTERIES

CROSS-REFERENCE TO RELATED APPLICATIONS

This application is based upon and claims the benefit of priority from Japanese Patent Application No. 2010-138189, filed on Jun. 17, 2010, the entire contents of which are incorporated herein by reference.

BACKGROUND

1. Field

The present application relates to a chuck mechanism for electrode terminals that is used in a charge/discharge testing device for flat-rechargeable batteries formed in a plate shape.

2. Description of the Related Art

A flat-rechargeable battery 1 formed in a plate shape as shown in FIG. 23 and FIG. 24 is used in many technical fields, and this flat-rechargeable battery 1 has a pair of electrode terminals 5, 7 in a thin piece shape projecting in one direction from a flat case 3.

Similarly to conventional rechargeable batteries, the flat-rechargeable batteries 1 also undergo a charge/discharge test for quality inspection several times after produced in a factory, and thereafter acceptable products are half-charged to be shipped as products.

FIG. 25 shows a charge/discharge testing device for flat-rechargeable batteries disclosed in Japanese Unexamined Patent Application Publication No. 2000-58135, and this charge/discharge testing device 9 includes a charge/discharge rack 13 provided with a group of vertically hung clip-type coupling terminals 11 coupled with electrode terminals 5, 7 of flat-rechargeable batteries 1, a contact support 17 disposed to face the group of the coupling terminals 11 and supporting a group of contacts 15 coming into contact or separating from the coupling terminals 11, a support reciprocating mechanism 19 reciprocating the contact support 17 in a predetermined direction to make the corresponding coupling terminals 11 and contacts 15 come into contact with or separate from each other, and a charge/discharge power source 21 coupled with the group of the contacts 15, and the charge/discharge testing device 9 is capable of conducting a charge/discharge test of a large number of the flat-rechargeable batteries 1 at a time.

Further, Japanese Unexamined Patent Application Publication No. 2004-319334 discloses a charge/discharge and inspection system for flat-rechargeable batteries which includes a battery container in which many flat-rechargeable batteries are stored and arranged in a fixed direction, with electrode terminals of the flat-rechargeable batteries being inserted in many insertion holes formed in its bottom plate, and a chuck mechanism chucking the electrode terminals projecting from the insertion holes of the battery container, wherein the chuck mechanism is moved close to the battery container by a first operation (lift) mechanism after the many flat-rechargeable batteries are stored and arranged in the battery container, and thereafter the chuck mechanism is made to chuck the electrode terminals by a second operation (lift) mechanism.

In this manner, the charge/discharge testing device 9 is capable of conducting the charge/discharge test of the many flat-rechargeable batteries 1 at a time, but it took a lot of trouble to couple the flat-rechargeable batteries 1 (electrode terminals 5, 7) with the group of the many clip-type coupling terminals 11.

In addition, there have been pointed out drawbacks that a place for the charge/discharge test is limited and the whole device becomes large since the charge/discharge rack 13 including the group of the coupling terminals 11 are integrally assembled in the charge/discharge testing device 9.

Further, though capable of conducting the charge/discharge test of the many flat-rechargeable batteries at a time, the conventional example disclosed in Japanese Unexamined Patent Application Publication No. 2004-319334 requires a work of storing and arranging the many flat-rechargeable batteries in the battery container prior to the test and thus has a problem of poor workability.

On the other hand, however, at the time of the charge/discharge test, without the structure fixing the flat-rechargeable batteries such as the battery container, positions of electrodes of the flat-rechargeable batteries become irregular, which is likely to result in incapability of accurate chucking.

SUMMARY

The present application was invented in consideration of the above-described circumstances and has a proposition to provide a chuck mechanism of a charge/discharge testing device for flat-rechargeable batteries which makes it possible to lighten the aforesaid conventionally needed troublesome works, that is, the work of coupling the flat-rechargeable batteries with the group of the clip-type coupling terminals and the work of storing and arranging the many flat-rechargeable batteries in the battery container and which is capable of surely chucking the flat-rechargeable batteries (electrodes).

To attain the above proposition, a chuck mechanism of a charge/discharge testing device for flat-rechargeable batteries according to one embodiment of the present application includes a first guide engageable with a battery pressing member of a battery storage which moves according to a battery storage width of a plurality of flat-rechargeable batteries stored in parallel in the battery storage, and a plurality of chuck units arranged in parallel by being resiliently and continuously jointed and having the first guide on one end side, and a second guide mounted on each of the chuck units, wherein a chuck width of all of the chuck units resiliently arranged in parallel is adjusted according to the battery storage width of the flat-rechargeable batteries by an engagement of the first guide and the battery pressing member, and the second guide positions each of the chuck units being adjusted according to the battery storage width with corresponding flat-rechargeable batteries in the battery storage.

Another embodiment of the present application is the chuck mechanism, wherein the second guide is made up of a pair of two positioning pins fastening a positioner that is formed in the battery storage corresponding to each of the chuck units, and each pair of the positioning pins becomes shorter in order from both ends toward a center of the plurality of chuck units arranged in parallel.

Still another embodiment of the present application is the chuck mechanism, wherein the chuck units include a roller-retaining member which is movable in a front and rear direction of a support base when a driver mounted on the support base is driven and in which a plurality of divided roller-retaining members are movably arranged in parallel via a shaft extending in a left and right direction of the support base, the divided roller-retaining members arranging in parallel a plurality of pairs of rollers vertically on each front surface of the divided roller-retaining members, and a chuck-retaining member in which a plurality of divided chuck-retaining members each making one unit with each of the divided roller-retaining members are resiliently and movably arranged in parallel via the shaft extending in the left and right direction of the support base, wherein the divided chuck-retaining members each have a plurality of chuck members each made up of a pair of two strip-formed metal plates inserted through a gap between each of the pairs of rollers, with front end sides of the metal plates fanning out in a V shape in a plane view and with rear end sides of the metal plates coupled with electric wires of the charge/discharge testing device, and wherein the second guide is provided in each of the divided chuck-retaining members.

Yet another embodiment of the present application is the chuck mechanism, wherein an oxide film exfoliating/fastening member having a large number of projections on a fastening surface of the oxide film exfoliating/fastening member is fixed on front ends of a pair of two chuck members, and yet another embodiment of the present application is the chuck mechanism according to the above embodiment, wherein the oxide film exfoliating/fastening member has a guide inclining inward from the front end sides of the chuck members toward the fastening surface.

Yet another embodiment of the present application is the chuck mechanism, wherein slits are formed in a front and rear direction in the front ends of the chuck members, and the oxide film exfoliating/fastening member is fixed on each front end of the chuck members demarcated by the slits.

According the aforementioned embodiments, it is possible to chuck electrode terminals by the chuck units accurately and favorably while lightening troublesome works of storing and fixing a large number of flat-rechargeable batteries in a predetermined container or the like prior to a charge/discharge test as has been required conventionally.

That is, the present application is structured such that, in the battery storage side, it is only necessary to fasten the flat-rechargeable batteries which are arranged in parallel, and when the battery storage is thereafter moved close to the chuck mechanism, the first guide adjusts a chuck width of the chuck mechanism according to a battery storage width of the battery storage, and thereafter the chuck units resiliently and continuously joined with the first guide are positioned with the flat-rechargeable batteries by the second guide automatically and resiliently in sequence, which as a result has an advantage of improving chuck accuracy while reducing a work load.

DETAILED DESCRIPTION OF THE EMBODIMENTS

Hereinafter, an embodiment of the present invention will be described in detail based on the drawings.

Figure 1:
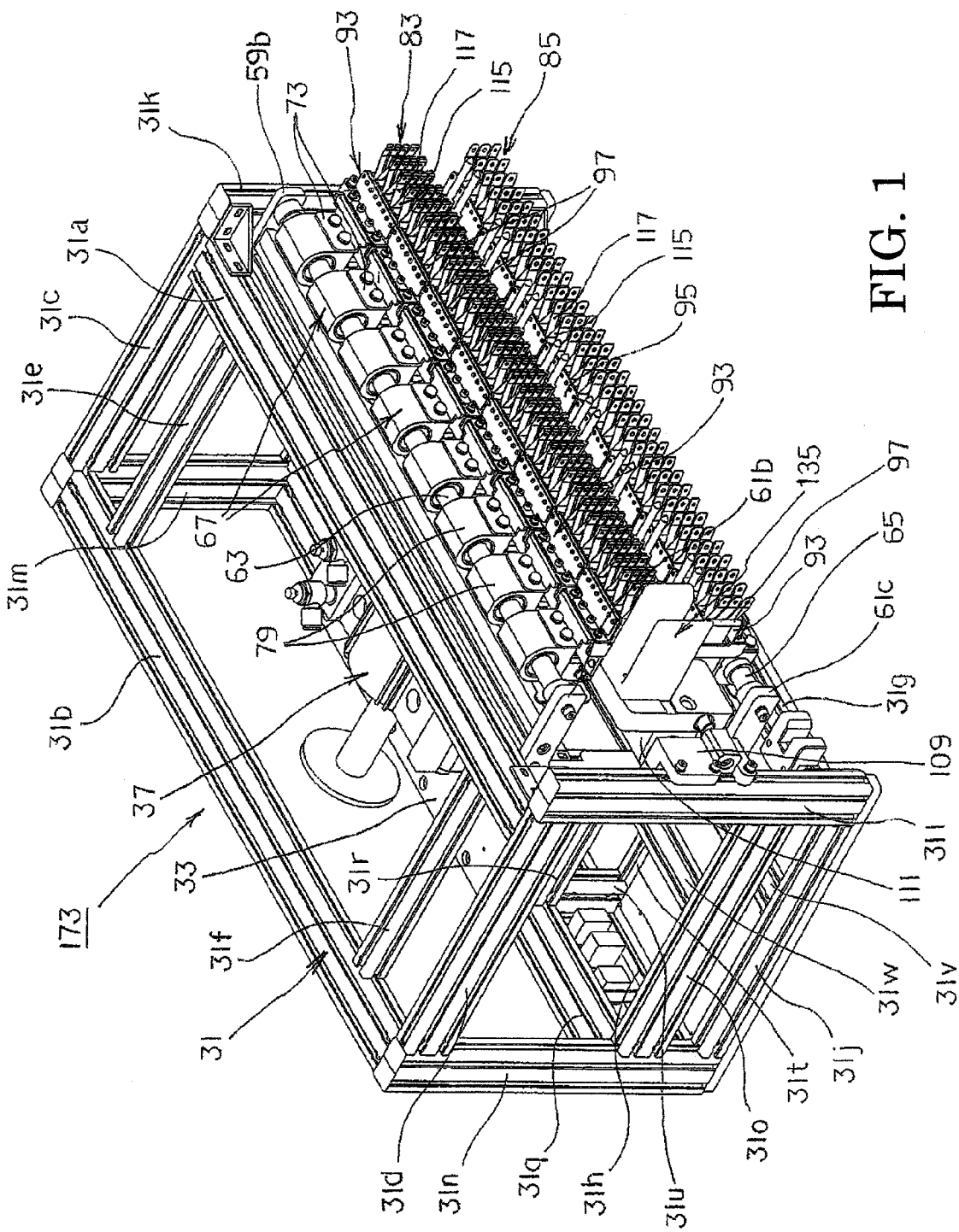
FIG. 1 is a front perspective view of a chuck mechanism.
Figure 2:
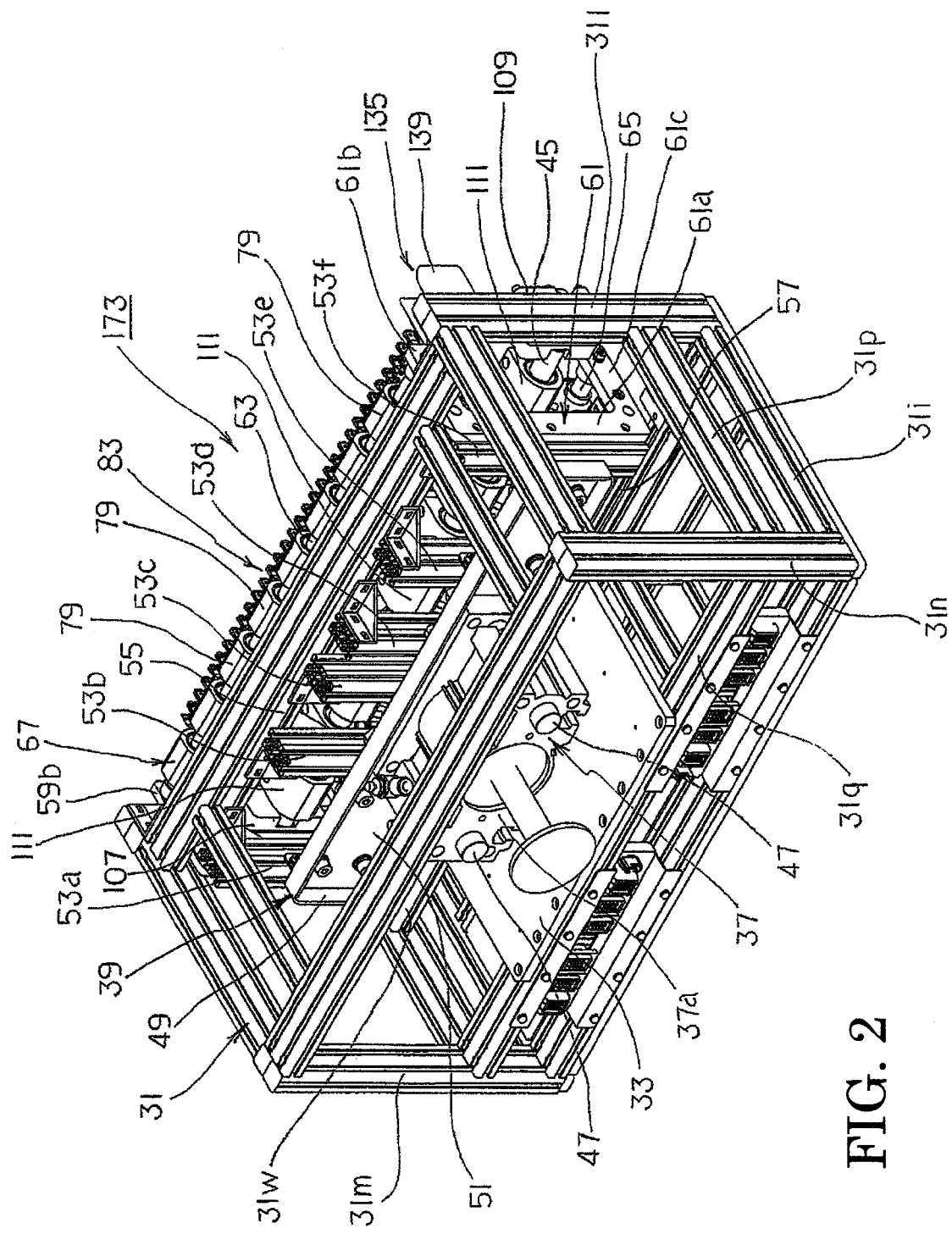
FIG. 2 is a rear perspective view of the chuck mechanism.
Figure 3:
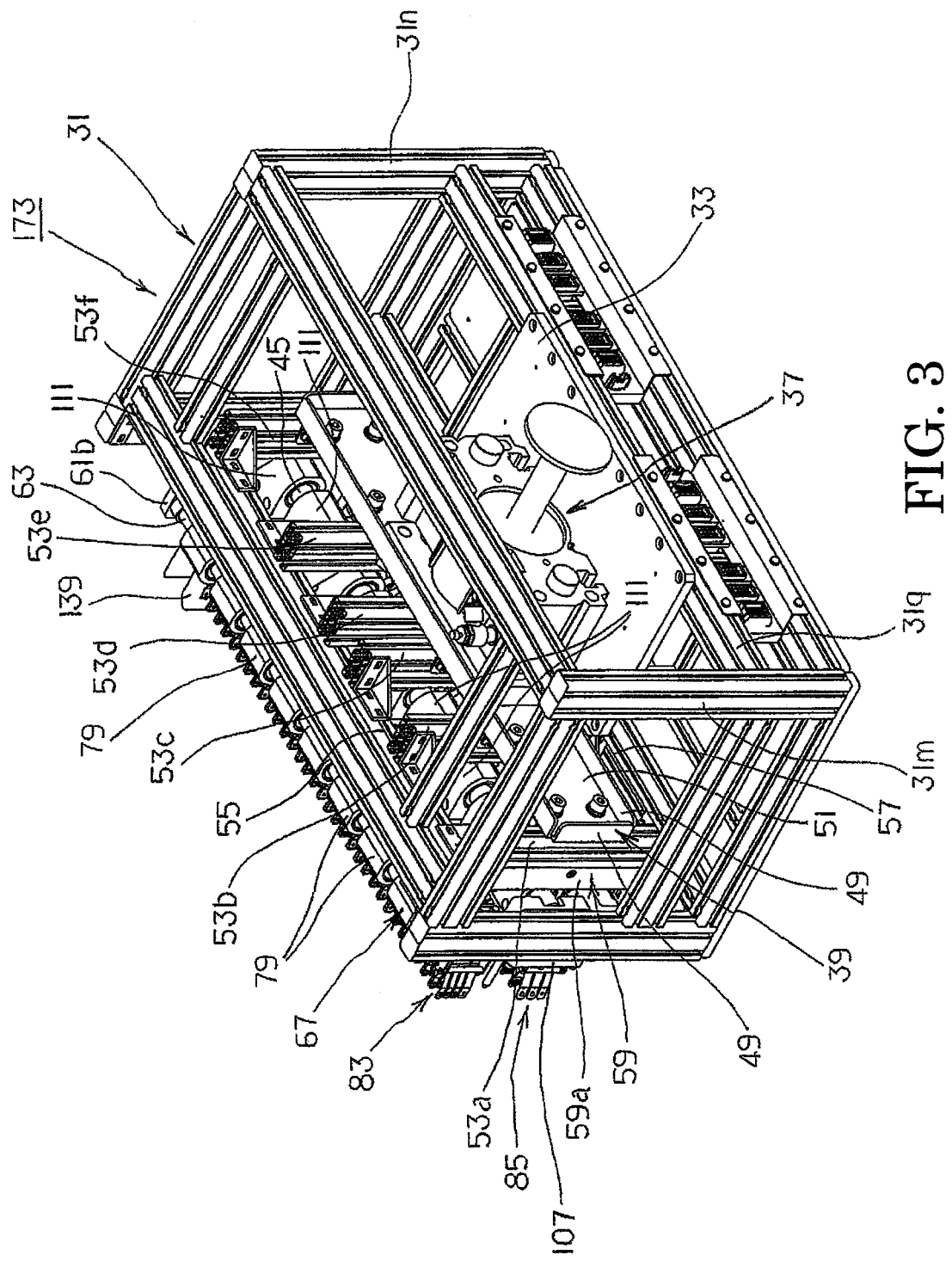
FIG. 3 is a rear perspective view of the chuck mechanism.
Figure 4:
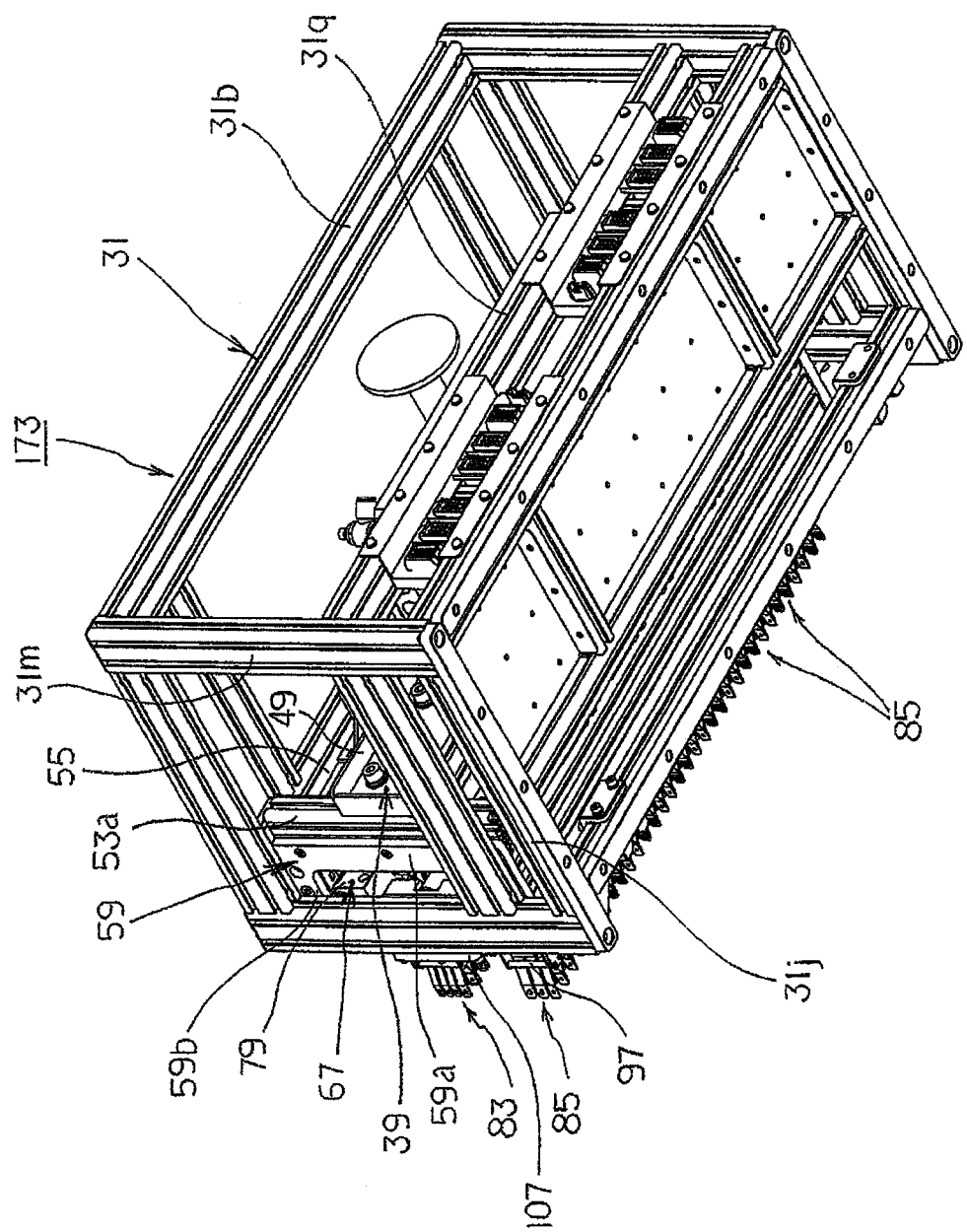
FIG. 4 is a rear perspective view of the chuck mechanism.
Figure 5:
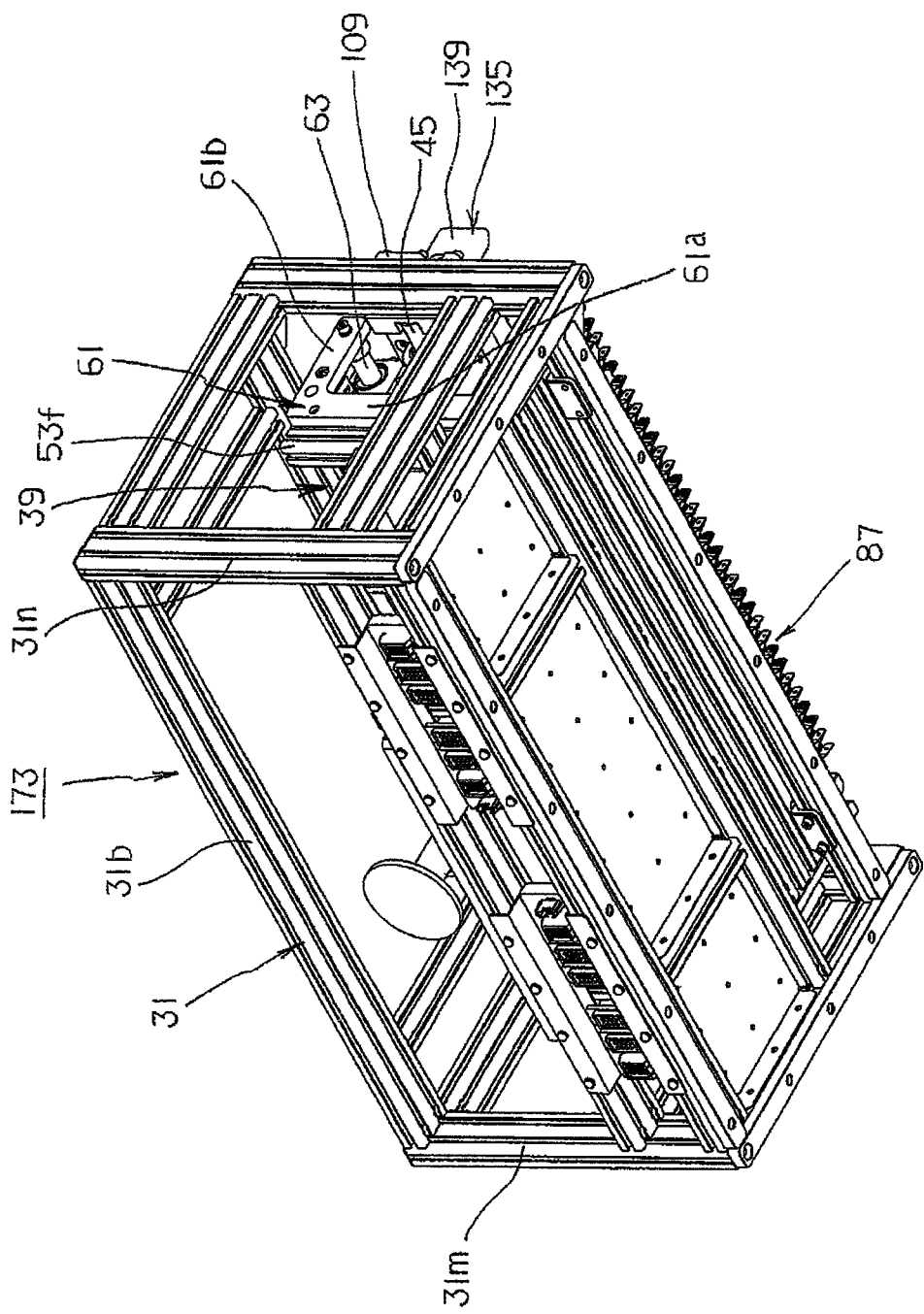
FIG. 5 is a rear perspective view of the chuck mechanism.

FIG. 1 to FIG. 12 show a chuck mechanism of a charge/discharge testing device for flat-rechargeable batteries according to an embodiment of the present invention, and in FIG. 1 to FIG. 5, 31 denotes a support base which is a rectangular parallelepiped frame made up of a plurality of support posts 31a to 31w disposed on front, back, right, and left sides, and as shown in FIG. 1 and FIG. 2, a mounting plate 33 in a rectangular shape in a plane view is mounted between the support post 31w, which is bridged between the left and right support posts 31o, 31p, and the support post 31q, which is bridged between the support posts 31m, 31n on left and right rear sides, and on the mounting plate 33, an air cylinder (driver) 37 whose piston rod 35 is expandable/contractible in a front and rear direction of the support base 31 is mounted as shown in FIG. 6 to FIG. 9.

As shown in FIG. 6 to FIG. 9, on a front end of the piston rod 35, a roller-retaining member 41 is mounted via a support frame 39, and further, a chuck-retaining member 43 facing the roller-retaining member 41 is mounted to be movable in a right and left direction of the support base 31 along one shaft 45 bridged between the left and right support posts 31k, 31l of the support base 31, and the roller-retaining member 41 and the chuck-retaining member 43 form chuck units in this embodiment.

Figure 6:
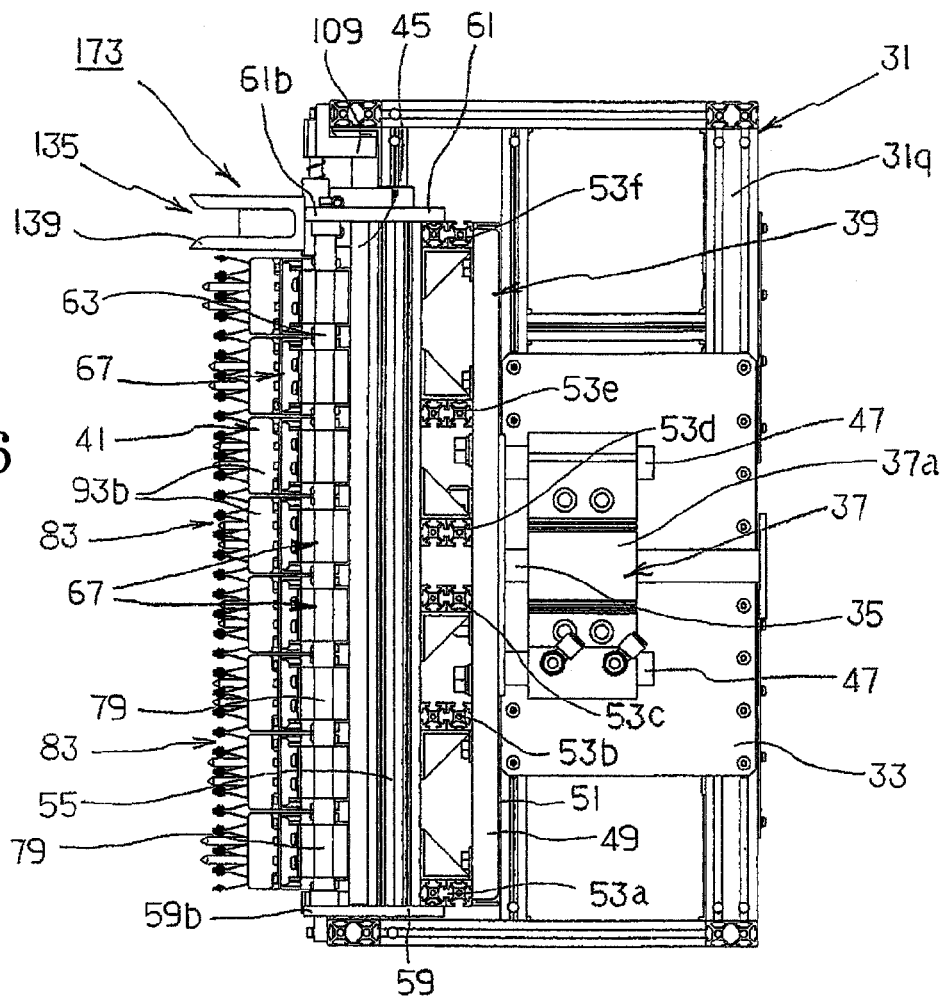
FIG. 6 is a plane view of the chuck mechanism.
Figure 8:
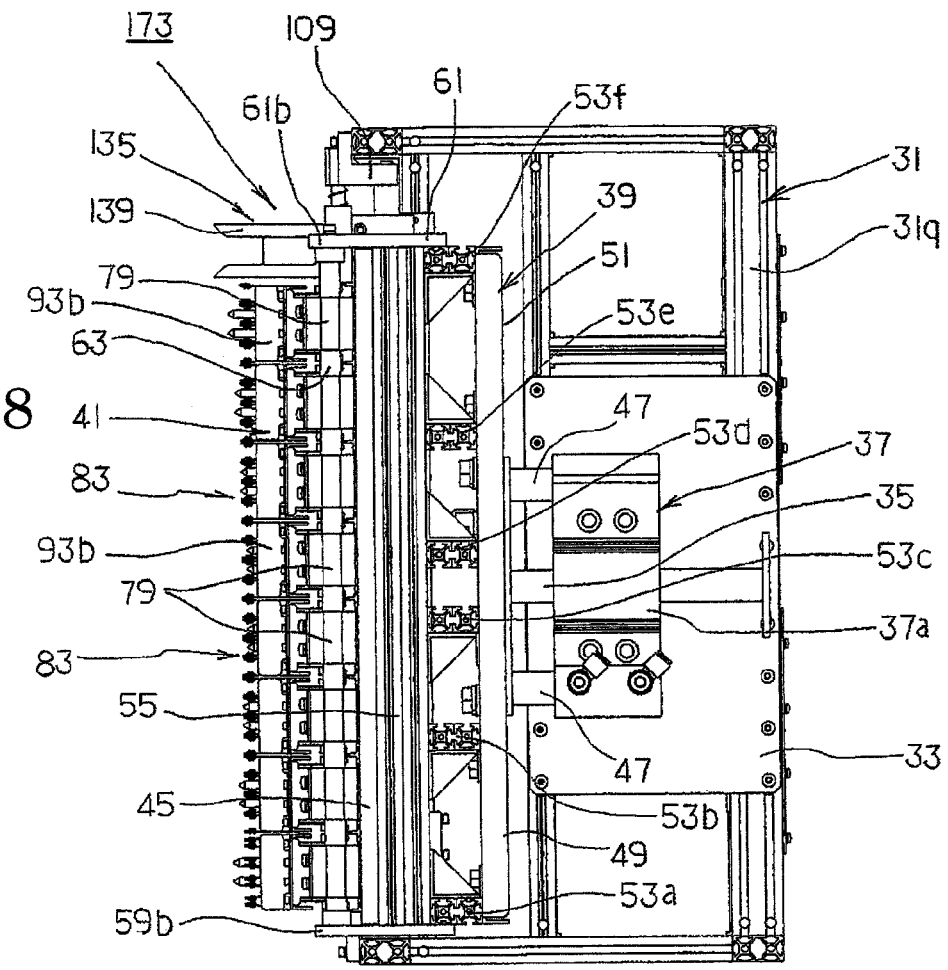
FIG. 8 is a plane view of the chuck mechanism in a state where chuck members are closed by rollers.
Figure 9:
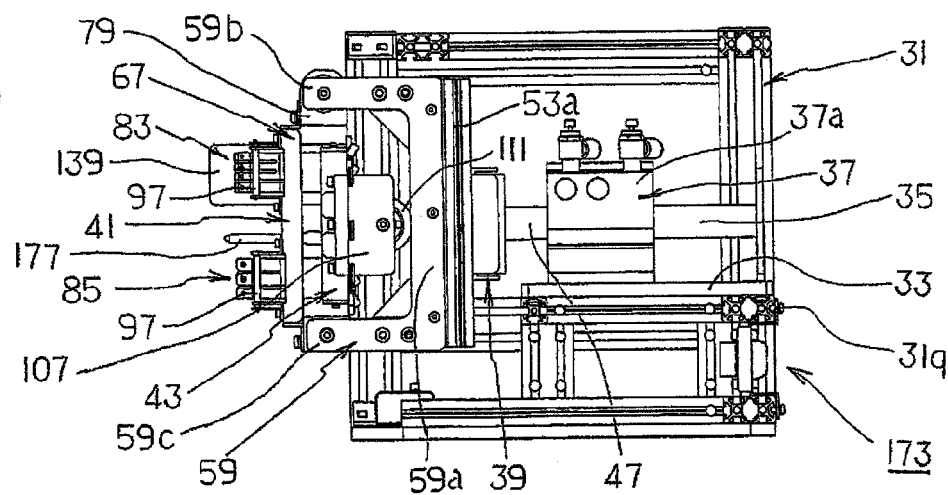
FIG. 9 is a side view of the chuck mechanism in the state where the chuck members are closed by the rollers.

Specifically, as shown in FIG. 2, FIG. 6, and FIG. 8, through a casing 37a of the air cylinder 37, columnar guide members 47 are inserted along the piston rod 35, one on the right side and the other one on the left side of the piston rod 35.

A coupler plate 51 in a rectangular shape in a front view made of one plate member and having a rising wall 49 for reinforcement formed along its peripheral edge is fixed to front ends of the both guide members 47 and the piston rod 35, so as to face a front surface of the support base 31 and so as to extend long in a lateral direction.

Six support posts 53*a*, 53*b*, 53*c*, 53*d*, 53*e*, 53*f* are fixed in an up and down direction to the coupler plate 51 at predetermined intervals, and one support post 55 and one support post 57 are fixed respectively to upper sides and lower sides of the support posts 53*a*, 53*b*, 53*c*, 53*d*, 53*e*, 53*f* so as to extend in the right and left direction of the support base 31. As shown in FIG. 2, FIG. 3, FIG. 7, and FIG. 9, one support plate 59 and one support plate 61 both in a C shape in a side view are fixed between left end portions of the upper and lower support posts 55, 57 and between right end portions thereof respectively, and the support posts 55, 57 are coupled with upper sides of base portions 59*a*, 61*a* of the support plates 59, 61 and with lower sides thereof respectively to form the support frame 39.

As shown in FIG. 1 to FIG. 6 and FIG. 10, one shaft 63 is bridged on front end sides of upper arms 59*b*, 61*b* projecting forward from upper portions of the base portions 59*a*, 61*a* of the support plates 59, 61, and one shaft 65 is bridged in parallel to the shaft 63 between front end sides of lower arms 59*c*, 61*c* projecting forward from lower portions of the base portions 59*a*, 61*a*. Between the two upper and lower shafts 63, 65, the roller-retaining member 41 in which a plurality of divided roller-retaining members 67 are arranged in parallel is formed.

Figure 11:
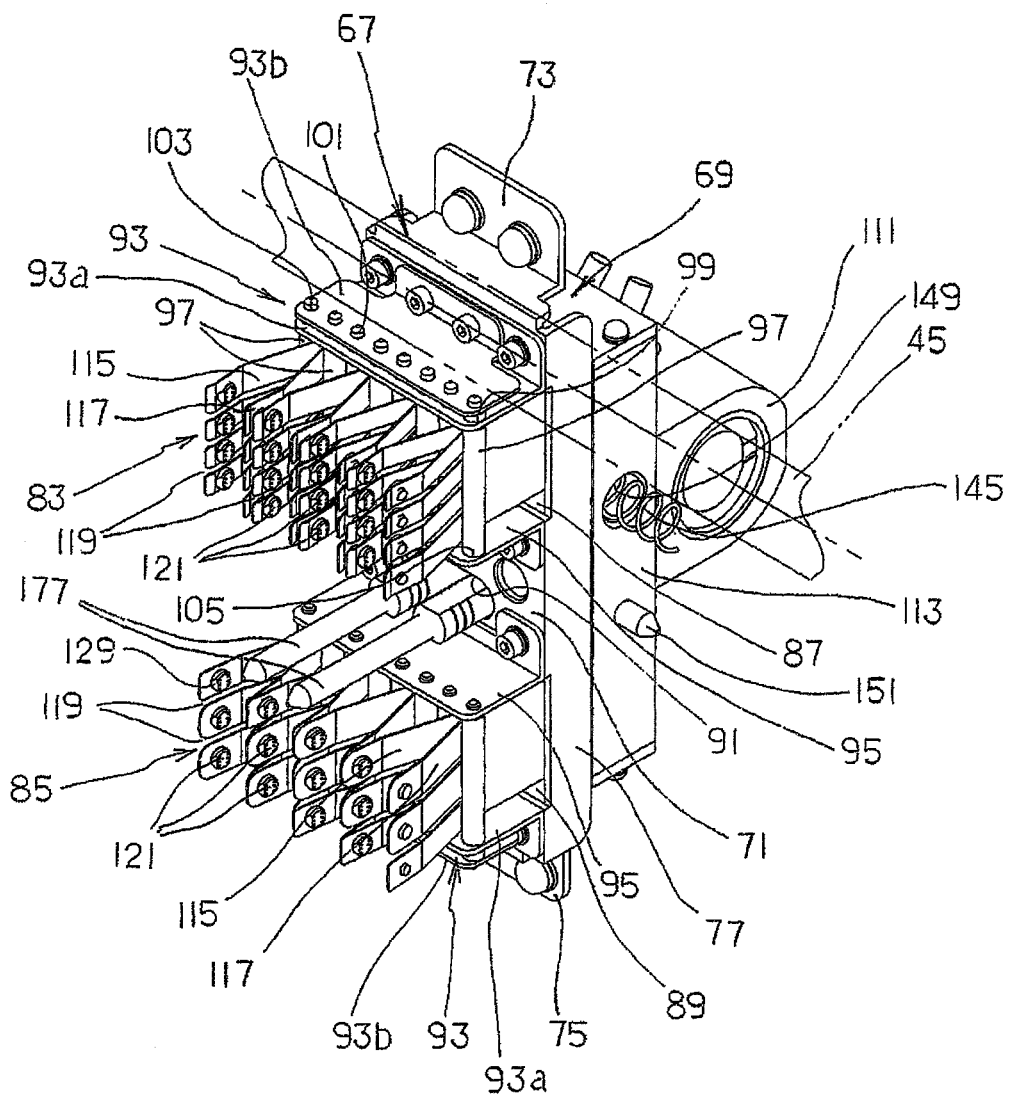
FIG. 11 is a front perspective view of a divided roller-retaining member and a divided chuck-retaining member.
Figure 12:
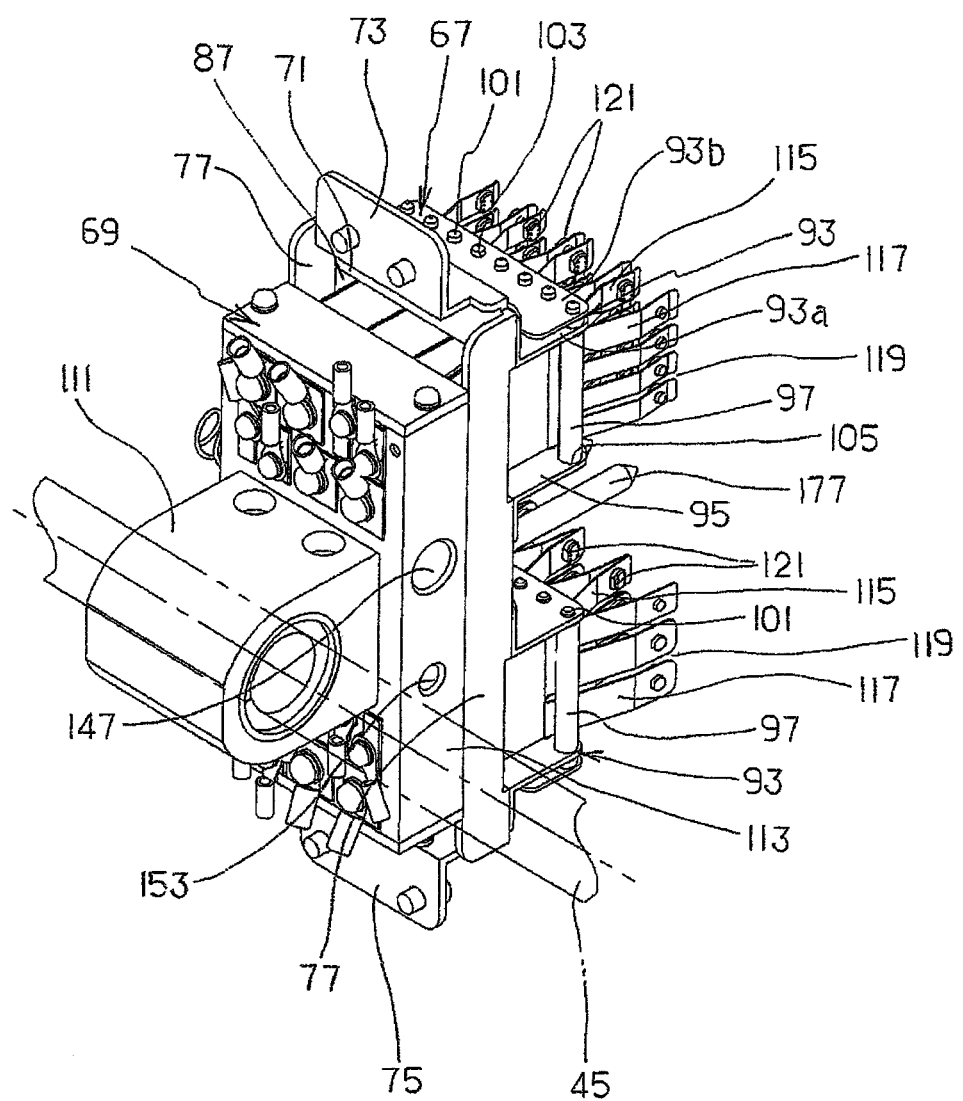
FIG. 12 is a rear perspective view of the divided roller-retaining member and the divided chuck-retaining member.

FIG. 11 and FIG. 12 show the divided roller-retaining member 67 and a divided chuck-retaining member 69 making a unit with the divided roller-retaining member 67. The plural divided roller-retaining members 67 are arranged in parallel between the shafts 63, 65 to form the roller-retaining member 41 as previously described, and the plural divided chuck-retaining members 69 are arranged in parallel along the shaft 45 to form the chuck-retaining member 43.

Figure 10:
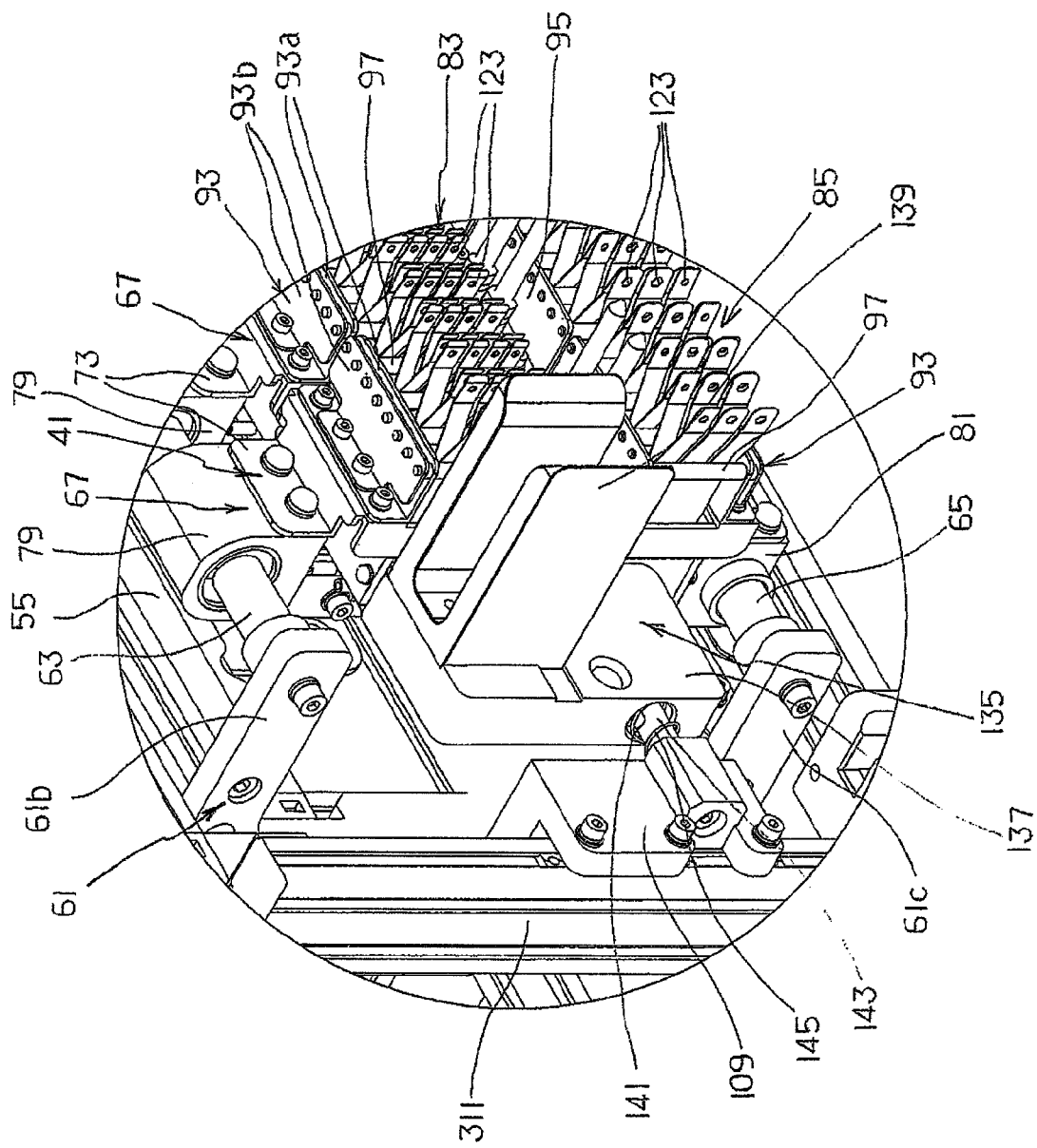
FIG. 10 is an enlarged perspective view of an essential part of the chuck mechanism.

In FIG. 11 and FIG. 12, 71 denotes a roller mounting plate being one plate, which has, on its upper and lower portions, mounting flanges 73, 75 each having a substantially L-shaped cross section and has, on its left and right sides, rising walls 77 for reinforcement. As shown in FIG. 10, retaining members 79 in a block shape through which the shaft 63 is inserted are fixed to the upper mounting flanges 73 and retaining members 81 in a block shape through which the shaft 65 is inserted are fixed to the lower mounting flanges 75, and all the divided roller-retaining members 67 are movably mounted between the upper and lower shafts 63, 65 via the retaining members 79, 81.

Further, as shown in FIG. 11, the roller mounting plate 71 has, in upper and lower portions of its front surface, insertion holes 87, 89 in a rectangular shape in a front view through which later-described plurality of pairs of chuck members 83, 85 are inserted, and a long hole 91 is opened in a lateral direction between the both insertion holes 87, 89. A pair of roller mounting brackets 93, 95 are fixed to upper and lower sides of the upper insertion hole 87, and four pairs of columnar rollers 97 are rotatably mounted between the both roller mounting brackets 93, 95.

As shown in FIG. 11, the upper roller mounting bracket 93 includes: a first roller mounting bracket 93*a* with a substantially L-shaped cross section in whose front ends a plurality of roller insertion holes 99 having the rollers 97 inserted therethrough are opened at equal intervals; and a second roller mounting bracket 93*b* with a substantially L-shaped cross section disposed above the first roller mounting bracket 93*a*, with a small gap therebetween, and support holes 103 supporting shafts 101 of the rollers 97 are provided in a front end portion of the second roller mounting bracket 93*b* in correspondence to the roller insertion holes 99.

In a front end portion of the other roller mounting bracket 95, support holes 105 supporting the shafts of the rollers 97 are formed in correspondence to the support holes 103, and the four pairs of rollers 97 are rotatably mounted between the roller mounting brackets 93, 95 via the roller insertion holes 99 and the support holes 103, 105.

A similar roller mounting bracket 93 is mounted upside down on a lower side of the lower insertion hole 89, and a similar roller mounting bracket 95 is mounted upside down on an upper side of the insertion hole 89, and a four pairs of rollers 97 are rotatably mounted between the both roller mounting brackets 93, 95.

The divided roller-retaining member 67 is thus structured, and the plural divided roller-retaining members 67 are movably mounted between the shafts 63, 65 to form the roller-retaining member 41 movable in the front and rear direction of the support base 31 by the air cylinder 37 being driven.

Next, the chuck-retaining member 43 will be described. As shown in FIG. 1 to FIG. 10, support brackets 107, 109 are mounted at substantially centers of the left and right support posts 31*k*, 31*l* of the support base 31 respectively, and the single shaft 45 is bridged between the both support brackets 107, 109 in parallel to the shafts 63, 65. As shown in FIG. 11 and FIG. 12, the shaft 45 is inserted through retaining members 111 of the divided chuck-retaining members 69.

As previously described, the divided chuck-retaining member 69 and the divided roller-retaining member 67 are formed as a unit to make a pair, and the plural divided chuck-retaining members 69 are arranged in parallel along the shaft 45 to form the chuck-retaining member 43.

In FIG. 11 and FIG. 12, 113 denotes a thick chuck mounting plate disposed along the roller mounting plate 71, and at a center of its rear surface side, the retaining member 111 in the block shape through which the shaft 45 is inserted is mounted. On a front surface of the chuck mounting plate 113, the four chuck members 83 disposed in parallel in the lateral direction and the four chuck members 85 disposed in parallel in the lateral direction, each corresponding to the aforesaid each pair of the rollers 97, are disposed in two tiers.

As is shown in the drawings, the chuck members 83, 85 are each made up of a pair of two metal plates 115, 117 in a strip shape having a spring property and made of, for example, phosphor bronze or the like, and rear end sides of the two metal plates 115, 117 are overlaid one on the other to be inserted through a through hole (not shown) formed in the chuck mounting plate 113. The rear ends of the metal plates 115 projecting from a rear surface of the chuck mounting plate 113 are bent in an L shape along the rear surface of the chuck mounting plate 113 to be screw-fixed to the rear surface.

Similarly, the rear ends of the other metal plates 117 projecting from the rear surface of the chuck mounting plate 113 are bent in an L shape along the rear surface of the chuck mounting plate 113 to be screw-fixed to the rear surface, and as shown in FIG. 12, the rear ends of the metal plates 115, 117 are cut out to a short length in the up and down direction to be disposed on the upper and lower side of the rear surface of the chuck mounting plate 113. Electric wires from the charge/discharge testing device can be coupled with the rear ends of the metal plates 115, 117 projecting from the rear surface of the chuck mounting plate 113.

As shown in FIG. 11, the aforesaid pairs of rollers 97 are each disposed so as to correspond to each of the chuck members 83, 85 (metal plates 115, 117) projecting to a front side of the chuck mounting plate 113, and each pair of the metal plates 115, 117 is inserted between each pair of the rollers 97.

As is shown in the drawings, front end sides of the metal plates 115, 117 inserted between the rollers 97 fan out in a substantially V shape in a plane view, with their leading ends being bent slightly inward, and as will be described later, when the roller-retaining member 41 moves forward by the air cylinder 37 being driven, each pair of the metal plates 115, 117 (chuck member 83, 85) fanning out in a substantially V shape in a plane view is closed by each pair of the rollers 97.

Further, slits 119 are formed in the front and rear direction in the front ends of the metal plates 115, 117, three slits 119 being formed in each of the metal plates 115, 117 forming the upper chuck member 83 and two slits 119 being formed in each of the metal plates 115, 117 forming the lower chuck member 85.

As shown in FIG. 11, a pair of oxide film exfoliating/fastening members (hereinafter, referred to as "exfoliating/fastening members) 121 are caulk-fixed to tip sides demarcated by the slits 119 in each pair of the metal plates 115, 117.

Figure 13A:
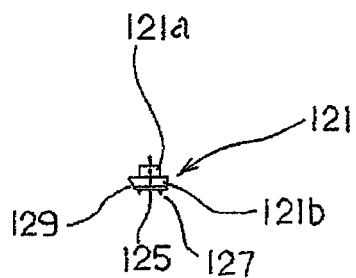
FIGS. 13A, B, C are a plane view, a front view, and a bottom view of an exfoliating/fastening member, respectively.
Figure 13B:
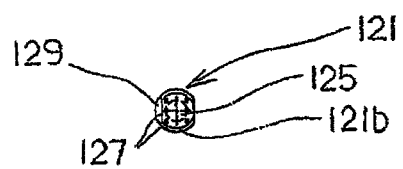
Figure 13C:
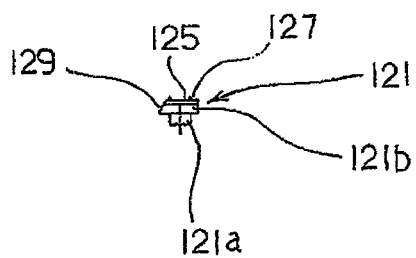

Specifically, as shown in FIG. 10, mounting holes 123 to which the exfoliating/fastening members 121 are caulk-fixed are provided in the front end sides demarcated by the slits 119 in the metal plates 115, 117. As shown in FIGS. 13A to 13C, the exfoliating/fastening members 121 each have a leg portion 121a caulk-fixed to the mounting hole 123 and a head portion 121b in a thick disk shape in a plane view integrally formed with the leg portion 121a. Six spike pins 127 are projectingly provided on a fastening surface 125 being a top portion of the head portion 121b, and as will be described later, when the metal plates 115, 117 are closed by the pair of rollers 97 while an electrode terminal 5, 7 of the flat-rechargeable battery 1 is interposed between the metal plates 115, 117, the six spike pins 127 of each of the exfoliating/fastening members 121 on one side and the six spike pins 127 of each of the exfoliating/fastening member 121 on the other side come into pressure contact with front and rear surfaces of the electrode terminal 5, 7 respectively to exfoliate the oxide films formed on the surfaces of the electrode terminal 5, 7.

Further, as shown in FIG. 11 and FIGS. 13(a) to (c), guides 129 inclining inward from the front end sides of the chuck members 83, 85 toward the fastening surfaces 125 are formed on the head portions 121b, and the guide members 129 guide the displaced electrode terminals 5, 7 to the fastening surfaces 125.

As previously described, the plural divided chuck-retaining members 69 are arranged in parallel along the shaft 45 to form the chuck-retaining member 43, and as shown in FIG. 1, FIG. 6, and FIG. 10, on the support post 31l side of the support base 31, one width-deciding/fastening member (first guide) 135 fastening a battery pressing plate 133 of a later-described magazine (battery storage) 131 is movably mounted on the shaft 45.

As is shown in the drawings, the width-deciding/fastening member 135 includes: a base 137 in a rectangular shape in a plane view that is equal in thickness to the chuck mounting plate 113; and a fastening arm 139 in a U-shape in a plane view mounted on a front surface of the base 137, and the retaining member 111 is mounted on a rear surface side of the base 137. Further, in lower portions of left and right side surfaces of the base 137, bottomed shaft insertion holes 141 each having a step therein are provided, and as shown in FIG. 10, positioning shafts 143 are inserted in the both shaft insertion holes 141 one per each, and further, a coil spring 145 is wound around an outer periphery of each of the positioning shafts 143.

The positioning shaft 143 inserted in the shaft insertion hole 141 on the support post 31l side is inserted and supported in a spring insertion hole (not shown) of a support bracket 109 mounted on the support post 31l, and one end side of the coil spring 145 is inserted and retained in the spring insertion hole.

The not-shown positioning shaft inserted in the shaft insertion hole (not shown) opposite the support post 31l and its coil spring are inserted and supported in a spring insertion hole 147 provided in the chuck mounting plate 113 adjacent thereto.

Specifically, as shown in FIG. 11, a spring mounting hole 149 in which one end side of the coil spring 145 is inserted and retained is formed in a left side surface of the chuck mounting plate 113, and thereunder, a positioning pin (rotation stopping pin) 151 is projectingly provided.

As shown in FIG. 12, in a right side surface of the chuck mounting plate 113, a spring insertion hole 147 in which the coil spring 145 on the adjacent chuck mounting plate 113 side is insertable and a positioning pin insertion hole 153 in which the positioning pin 151 is insertable are formed.

Figure 7:
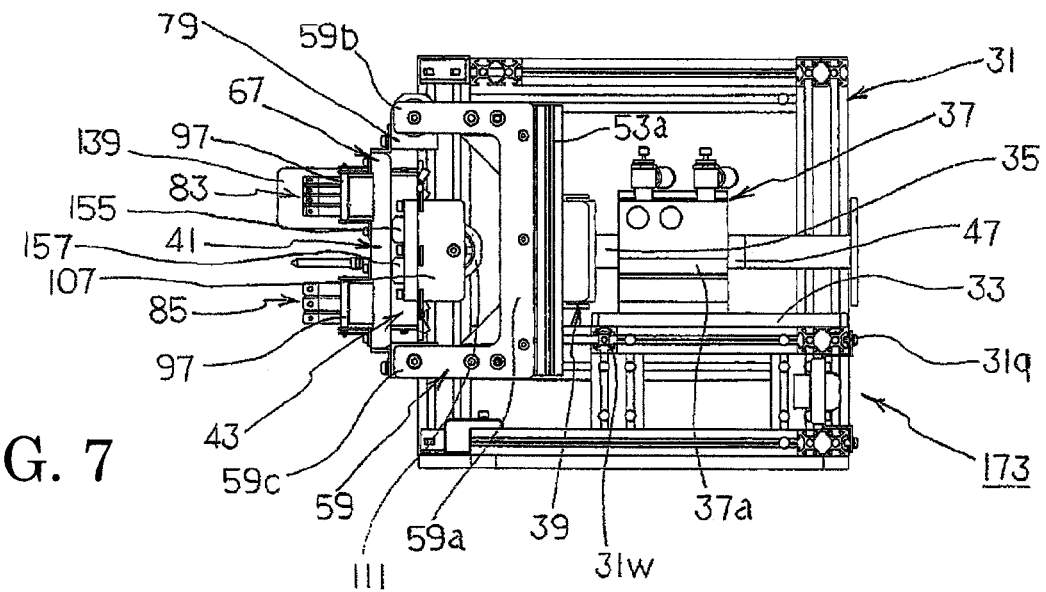
FIG. 7 is a side view of the chuck mechanism.

Further, as shown in FIG. 7, on upper and lower sides of the support bracket 107 mounted on the support post 31k, receiving parts 155, 157 retaining the coil spring 145 and the positioning pin 151 of the chuck mounting plate 113 adjacent to the support post 31k are formed, so that the divided chuck-retaining members 69 and the width positioning/fastening member 135 which are arranged along the shaft 45 between the left and right support posts 31k, 31l are continuously provided via the coil springs 145 and the positioning pins 151, and are arranged at equal intervals between the supports 31k, 31l owing to spring forces of the coil springs 145.

Figure 14:
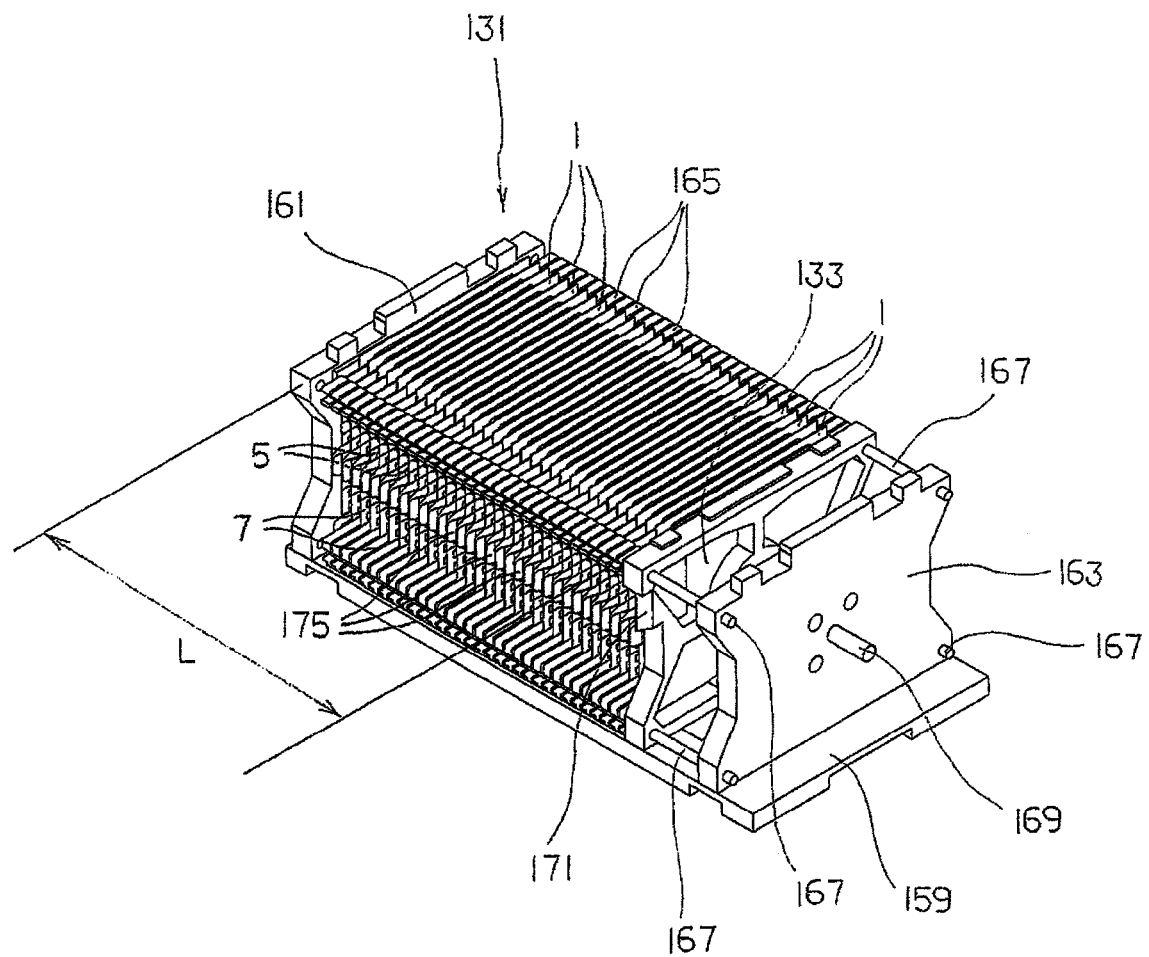
FIG. 14 is a front perspective view of a magazine.

FIG. 14 shows the magazine 131 in which a large number of the flat-rechargeable batteries 1 as targets of the charge/discharge test are stored, and as shown in the drawing, the magazine 131 includes: a pair of side plates 161, 163 disposed on the left and right of a base 159 in a rectangular shape in a plane view; a plurality of partition walls 165 arranged between the both side plates 161, 163; the battery pressing plate 133 disposed on one end side (plate 163 side) of a group of the partition walls 165 so as to face the width positioning/fastening member 135; and four guide stays 167 passing through four corners of each of the partition walls 165 and the battery pressing plate 133 and bridged between four corners of the side plate 161 and four corners of the side plate 163, and the partition walls 165 and the battery pressing plate 133 are movable along the guide stays 167.

Figure 17:
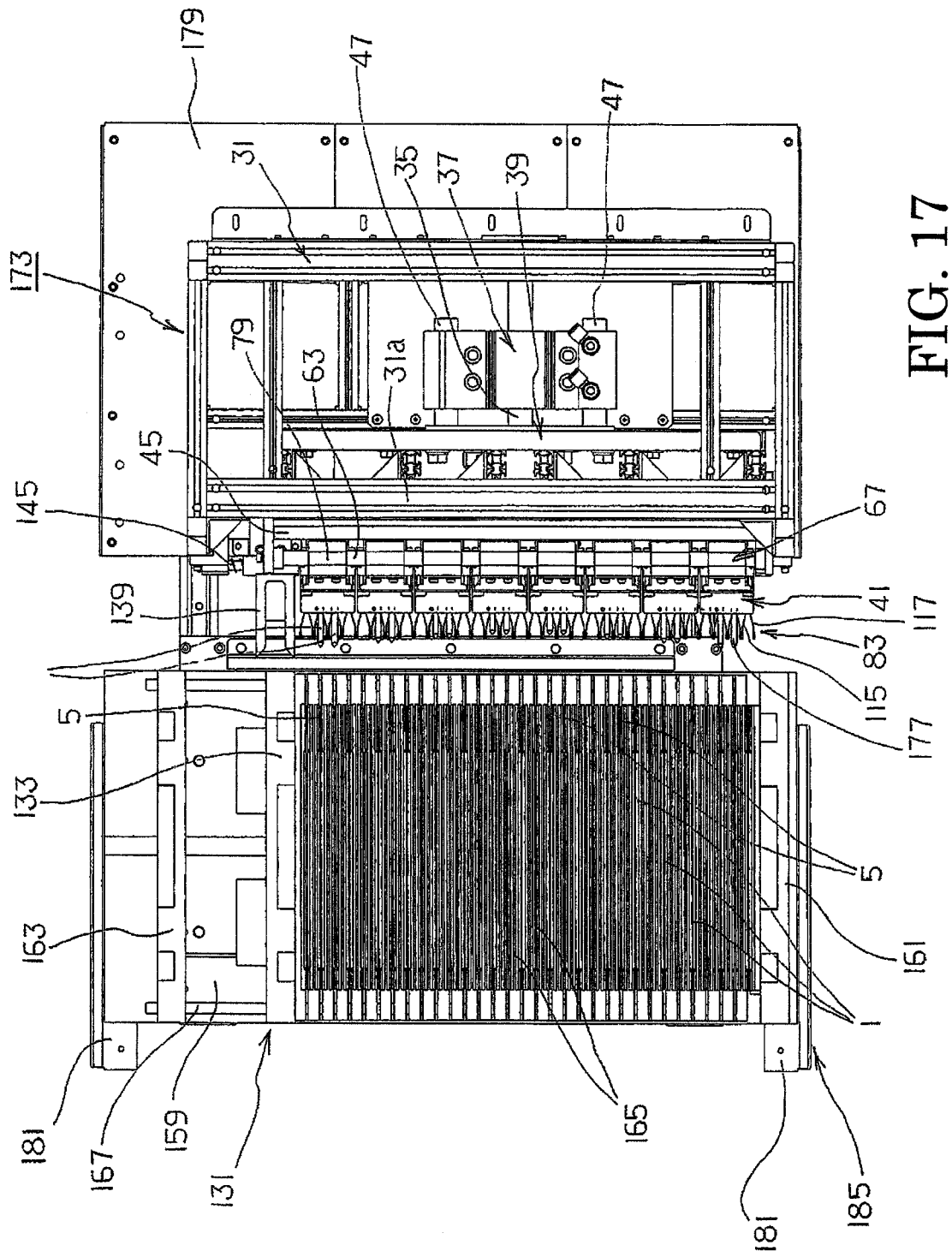
FIG. 17 is a plane view of the chuck mechanism and the magazine disposed to face the chuck mechanism.
Figure 18:
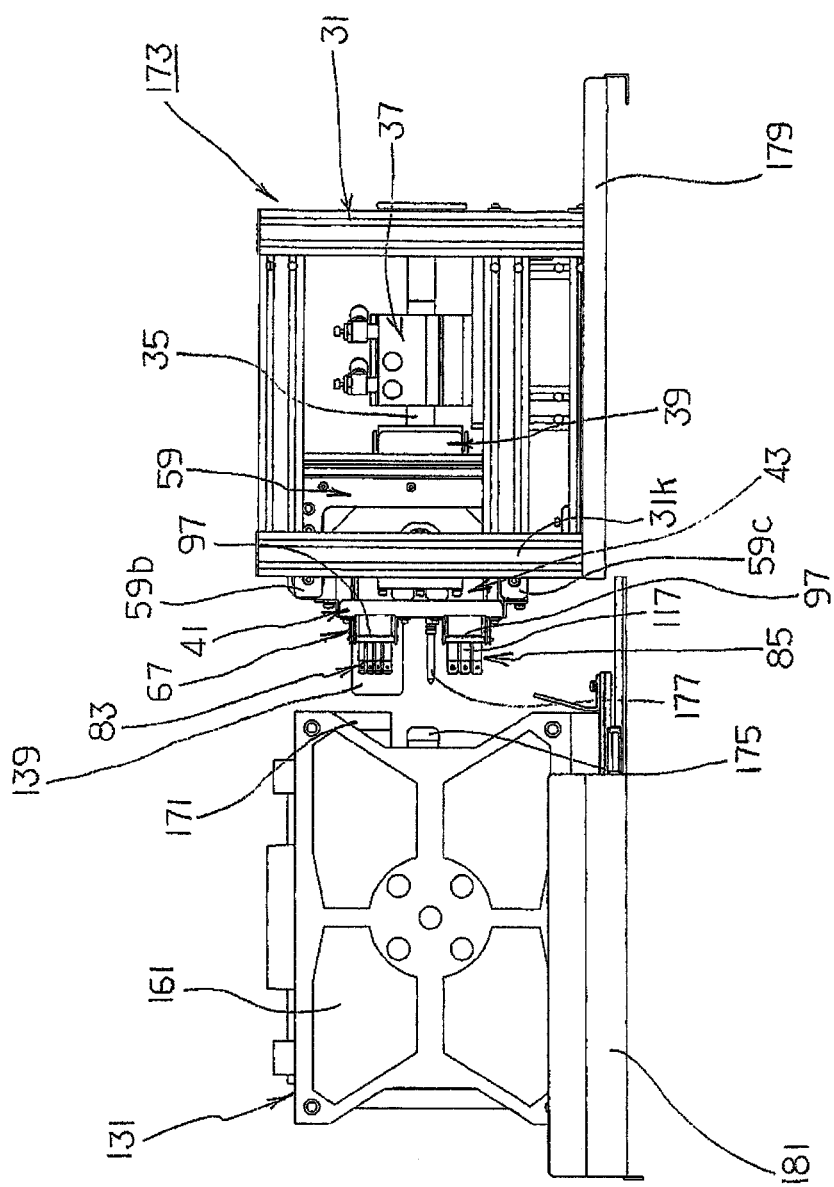
FIG. 18 is a side view of the chuck mechanism and the magazine disposed to face the chuck mechanism.

As shown in FIG. 14 and FIG. 17, between the side plate 161 and the battery pressing plate 133, the partition walls 165 demarcate and form storage chambers each storing one flat-rechargeable battery 1 in a vertical direction, with the electrode terminals 5, 7 projected forward (chuck members 83, 85 side). The number of the storage chambers demarcated by the partition walls 165 is equal to the number of the upper and lower chuck members 83, 85.

On a side surface of the battery pressing plate 133, a not-shown screwing part is formed, and one end side of one adjustment screw 169 inserted through the side plate 163 is screwed to the screwing part. When the adjustment screw 169 is loosened, the partition walls 165 become movable along the guide stays 167 between the side plate 161 and the battery pressing plate 133, and when the adjustment screw 169 is fastened after the flat-rechargeable batteries 1 are stored in the storage chambers, one for each, the battery pressing plate 133 presses and fixes the partition walls 165, so that a battery storage width L of the magazine 131 is decided according to the number of the partition walls 165.

Figure 19:
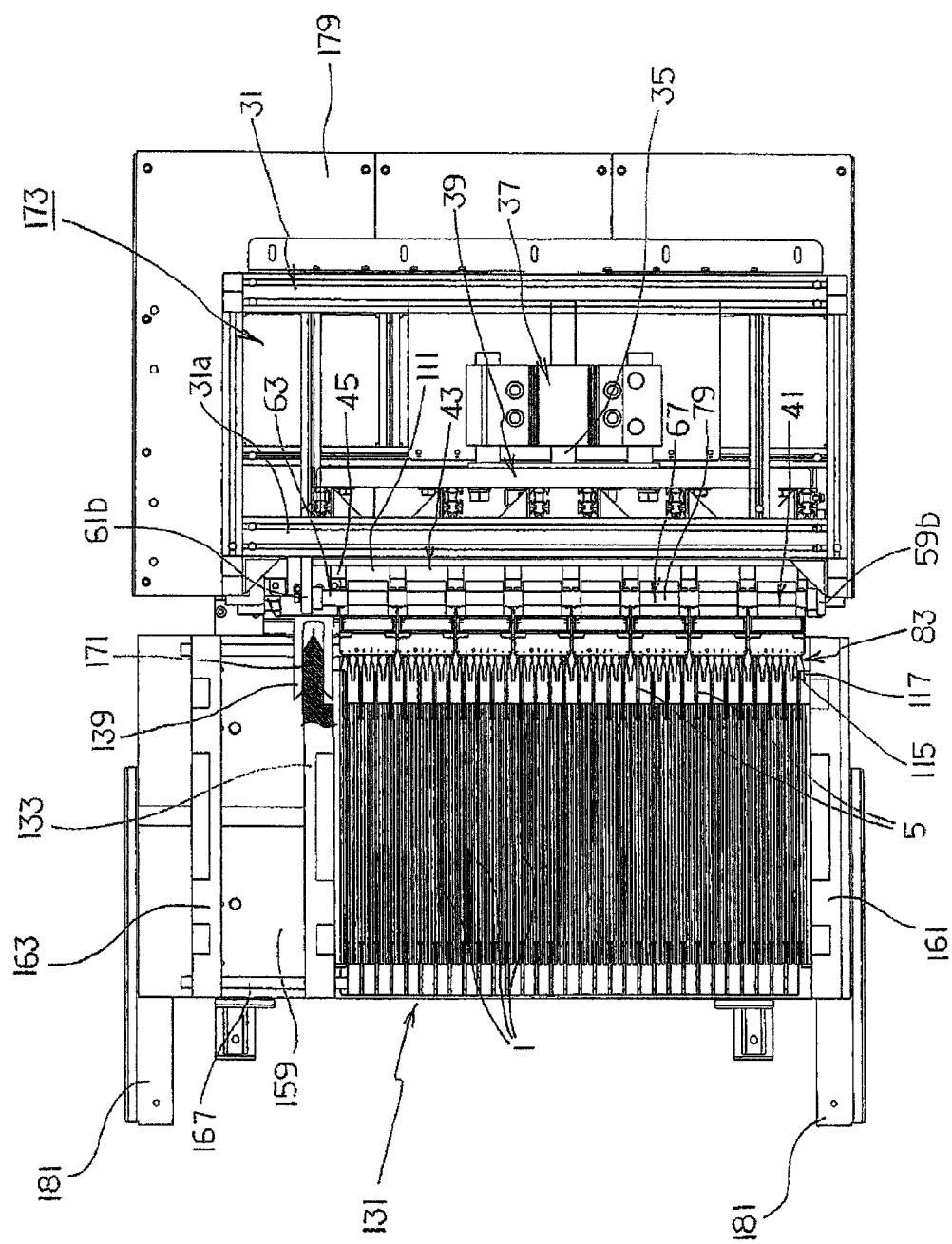
FIG. 19 is a plane view of the chuck mechanism and the magazine disposed to face the chuck mechanism.

Further, as shown in FIG. 14 and FIG. 19, on the battery pressing plate 133, a tapered fastened piece (positioner) 171 projecting toward the fastening arm 139 is provided, and as will be described later, when the magazine 131 is pulled toward the chuck mechanism 173 of this embodiment, the fastening arm 139 first fastens the fastened piece 171 as shown in FIG. 19.

Therefore, the positions of the divided chuck-retaining members 69 and the width-deciding/fastening member 135 which are arranged along the shaft 45 between the left and right support posts 31k, 31l at equal intervals owing to the spring forces of the coil springs 145 as previously described are newly adjusted so that they are arranged at equal intervals within a dimension of the battery storage width L owing to the spring forces. At this time, the positioning pins 151 provided on the respective divided chuck-retaining members 69 are inserted in the pin insertion holes 153 of the adjacent divided chuck-retaining members 69 to position the divided chuck-retaining members 69, which prevent the rotation of the chuck-retaining members 43 around the shaft 45.

Figure 15:
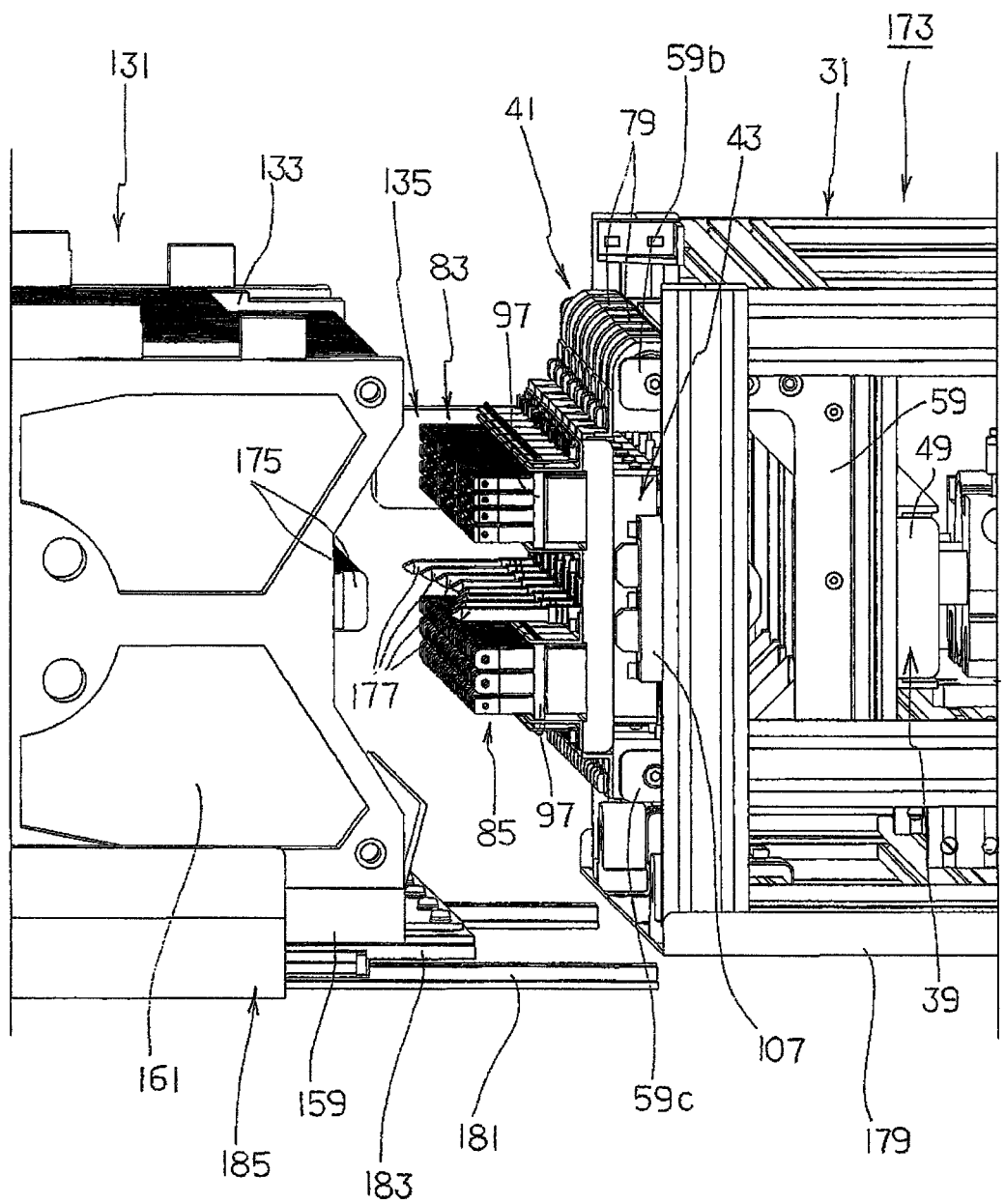
FIG. 15 is an enlarged perspective view of an essential part of the chuck mechanism and the magazine disposed to face the chuck mechanism.

Further, as shown in FIG. 14 and FIG. 15, at the centers of the partition walls 165, second fastened pieces (positioners) 175 projecting toward the chuck mechanism 173 are provided, and the fastened pieces 175 are tapered and are located on a more back side than the fastened piece 171.

As shown in FIG. 11, in each of the divided chuck-retaining members 69, two positioning pins (second guides) 177 inserted through the long hole 91 of the roller mounting plate 71 are provided so as to project forward, and when the fastening arm 139 fastens the fastened piece 171 as is previously described and the magazine 131 is thereafter further pulled toward the chuck mechanism 173, the two positioning pins 177 fasten the single fastened piece 175 facing them, from left and right.

Incidentally, as shown in FIG. 15, pairs of the two positioning pins 177 are formed to become shorter in order from those of the left and right divided chuck-retaining members 69 to those of the center divided chuck-retaining member 69, so that all the positioning pins 177 do not fasten the fastened pieces 175 at a time but the positioning pins 177 sequentially fasten the fastened pieces 175 in order from the left and right side positioning pins 177 to the center positioning pins 177.

Figure 16:
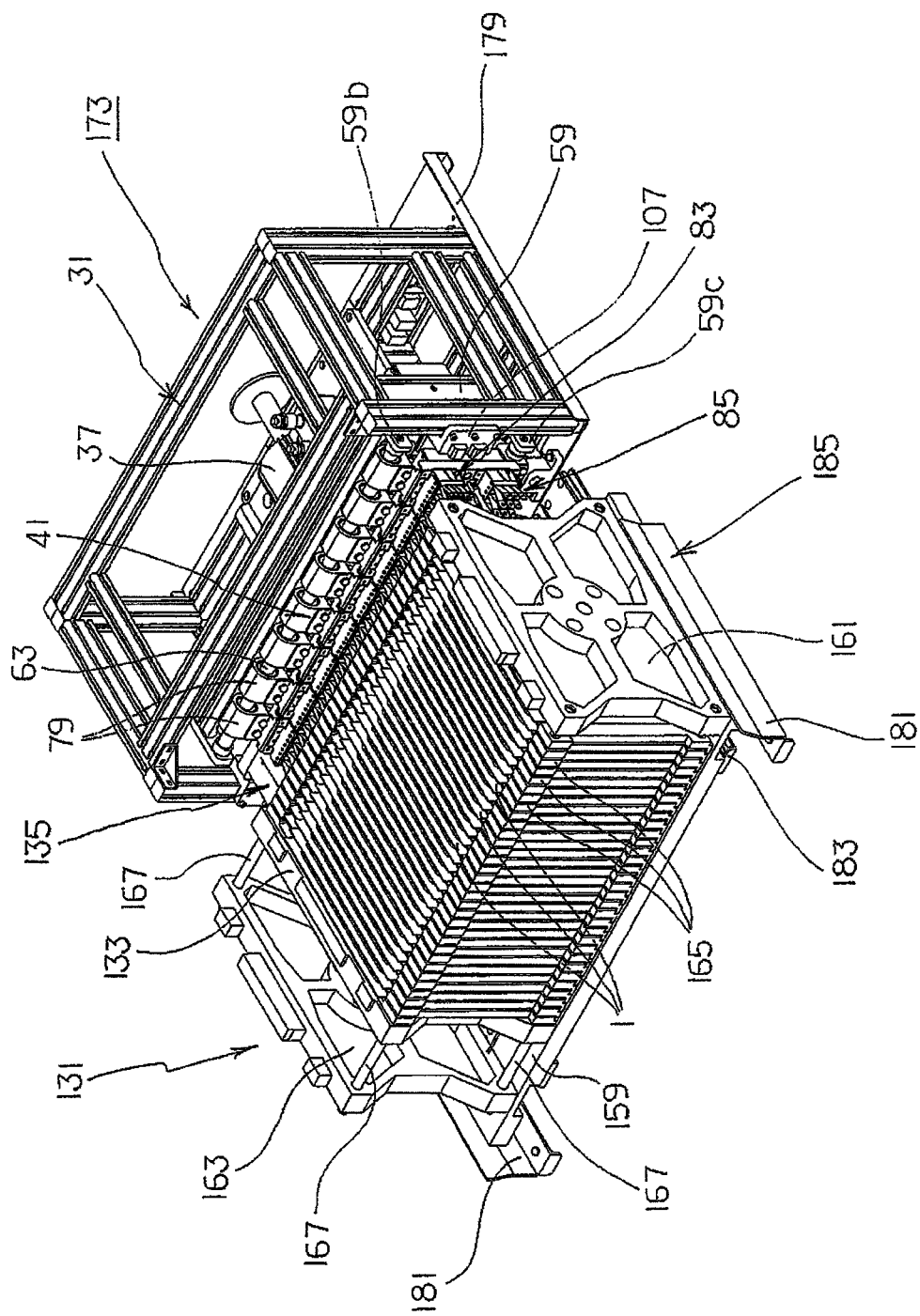
FIG. 16 is a perspective view of the chuck mechanism and the magazine disposed to face the chuck mechanism.

The chuck mechanism 173 according to this embodiment and the magazine 131 are structured as above, and to conduct the charge/discharge test of the flat-rechargeable batteries 1 by using the chuck mechanism 173, the chuck mechanism 173 is first placed on a predetermined mounting table 179 as shown in FIG. 16.

As shown in FIG. 15 and FIG. 16, in front of the mounting table 179, a guide mechanism 185 including two guide rails 181 and a movable table 183 movably mounted on the two guide rails 181 is installed. A piston rod of a not-shown air cylinder mounted on a rear surface side of the mounting table 179 is coupled with the movable table 183, so that the movable table 183 is movable in the front and rear direction along the guide rails 181 when the air cylinder is driven.

Next, the magazine 131 in FIG. 14 in whose storage chambers the plural flat-rechargeable batteries 1 are stored is carried onto the movable table 183 by a stacker crane and the base 159 is fixed to the movable table 183. At this time, in the magazine 131, the adjustment screw 169 has already been fastened and the predetermined battery storage width L has been set.

Consequently, as shown in FIG. 15 to FIG. 18, the magazine 131 is disposed on the movable table 183 so as to face the chuck mechanism 173, and the electrode terminals 5, 7 of the flat-rechargeable batteries 1 are disposed to face the chuck members 83, 85 respectively.

The chuck mechanism 173 and the magazine 131 are pre-designed so that at this time, the fastening arm 139 of the width-deciding/fastening member 135 faces the battery pressing plate 133. Further, the number of the storage chambers demarcated by the partition walls 165 is equal to the number of the chuck members 83, 85 as previously described, and therefore, the number of the chuck members 83, 85 and the number of the flat-rechargeable batteries 1 are equal to each other.

Thereafter, when the air cylinder on the rear surface side of the mounting table 179 is driven to contract the piston rod coupled with the movable table 183, the fastening arm 139 first fastens the fastened piece 171 of the battery pressing plate 133 while the magazine 131 moves along the guide rails 181 toward the chuck mechanism 173.

Then, the adjustment is automatically made anew so that the divided chuck-retaining members 69 arranged between the left and right support posts 31k, 31l at equal intervals owing to the spring forces of the coil springs 145 are arranged at equal intervals between the width fastening member 135 and the support 31k within the dimension of the battery storage width L owing to the spring forces, and at this time, the positioning pins 151 are inserted in the pin insertion holes 153 of the adjacent divided chuck-retaining members 69 to position the divided chuck-retaining members 69, so that the rotation of the chuck-retaining member 43 around the shaft 45 is constantly prevented.

Figure 20:
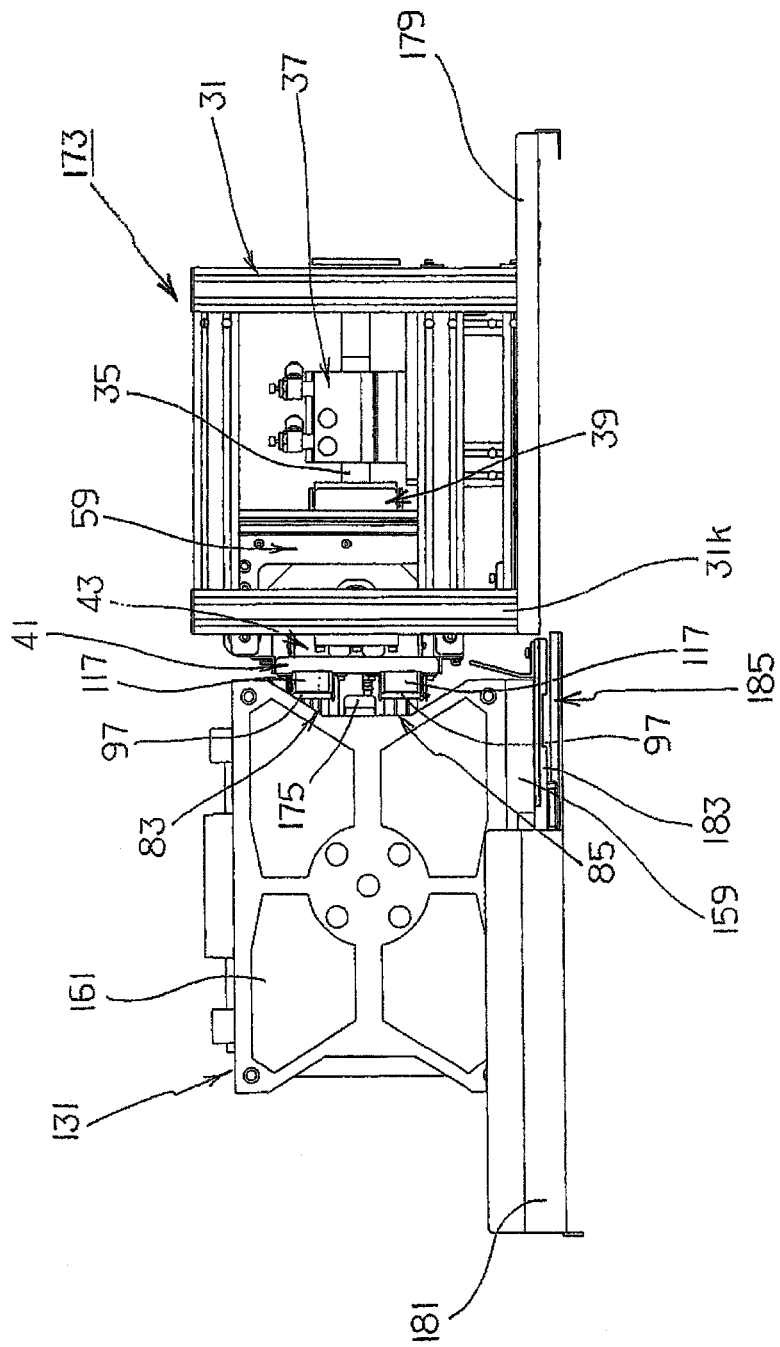
FIG. 20 is a side view of the chuck mechanism and the magazine disposed to face the chuck mechanism.

In accordance with further movement of the magazine 131, while the positioning pins 177 projectingly provided on the right and left divided chuck-retaining members 69 with longer length fasten the fastened pieces 175 first, the divided chuck-retaining members 69 therebetween are arranged at equal intervals owing to the spring forces of the coil springs 145, and then their intervals are further equally adjusted sequentially. Then, as shown in FIG. 19 and FIG. 20, when the magazine 131 moves by a predetermined distance and the air cylinder stops, the electrode terminals 5, 7 of each of the flat-rechargeable batteries 1 are disposed between the two metal plates 115, 117 of the upper chuck member 83 and the two metal plates 115, 117 of the lower chuck members 85 respectively.

Incidentally, since the exfoliating/fastening members 121 fixed on the metal plates 115, 117 have the guides 129 inclining inward from the tip end sides of the chuck members 83, 85 toward the fastening surfaces 125 as previously described, such guide members 129 guide the displaced electrode terminals 5, 7 to the fastening surfaces 125.

Figure 21:
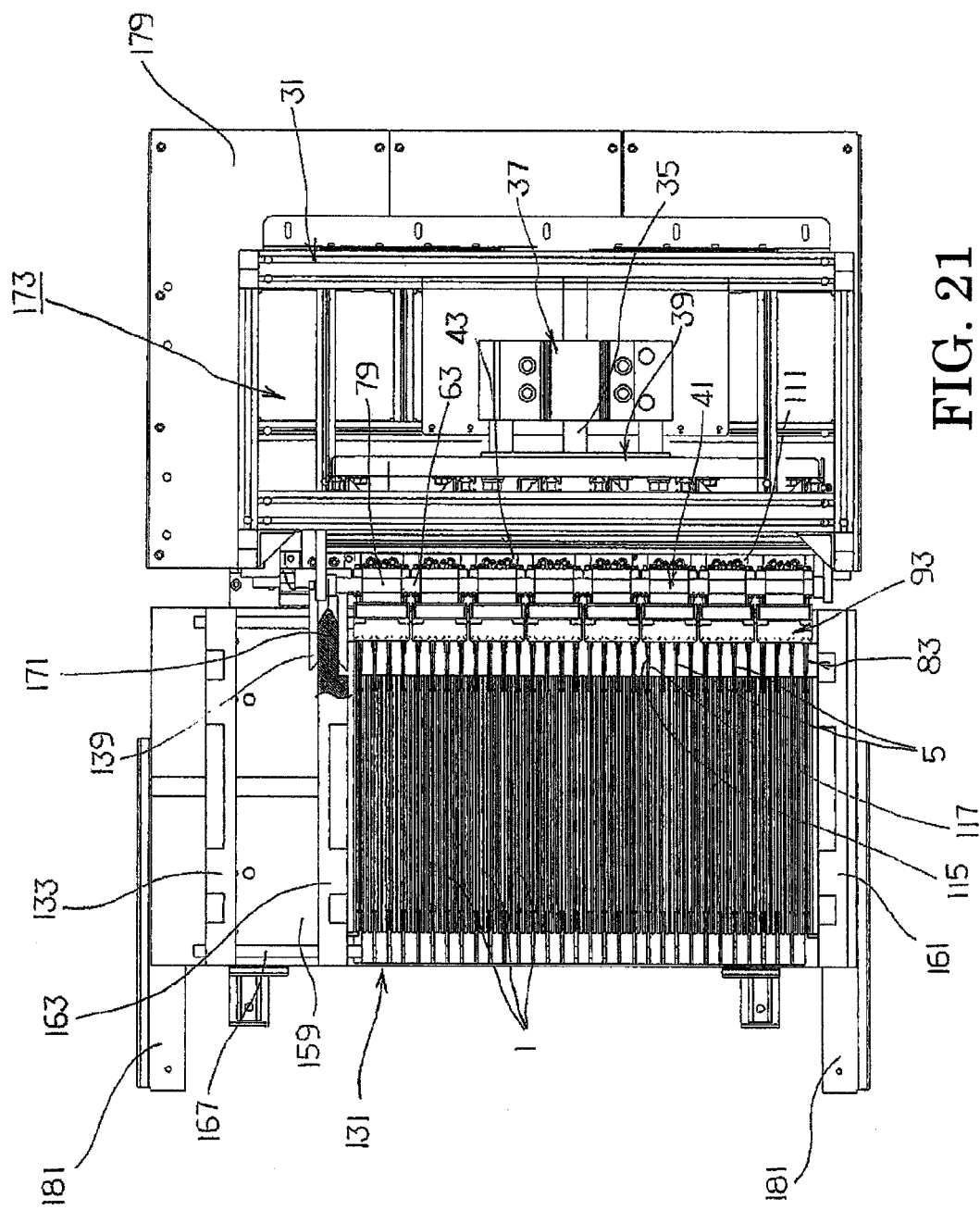
FIG. 21 is a plane view of the chuck mechanism whose chuck members are fastening electrode terminals, and the magazine.
Figure 22:
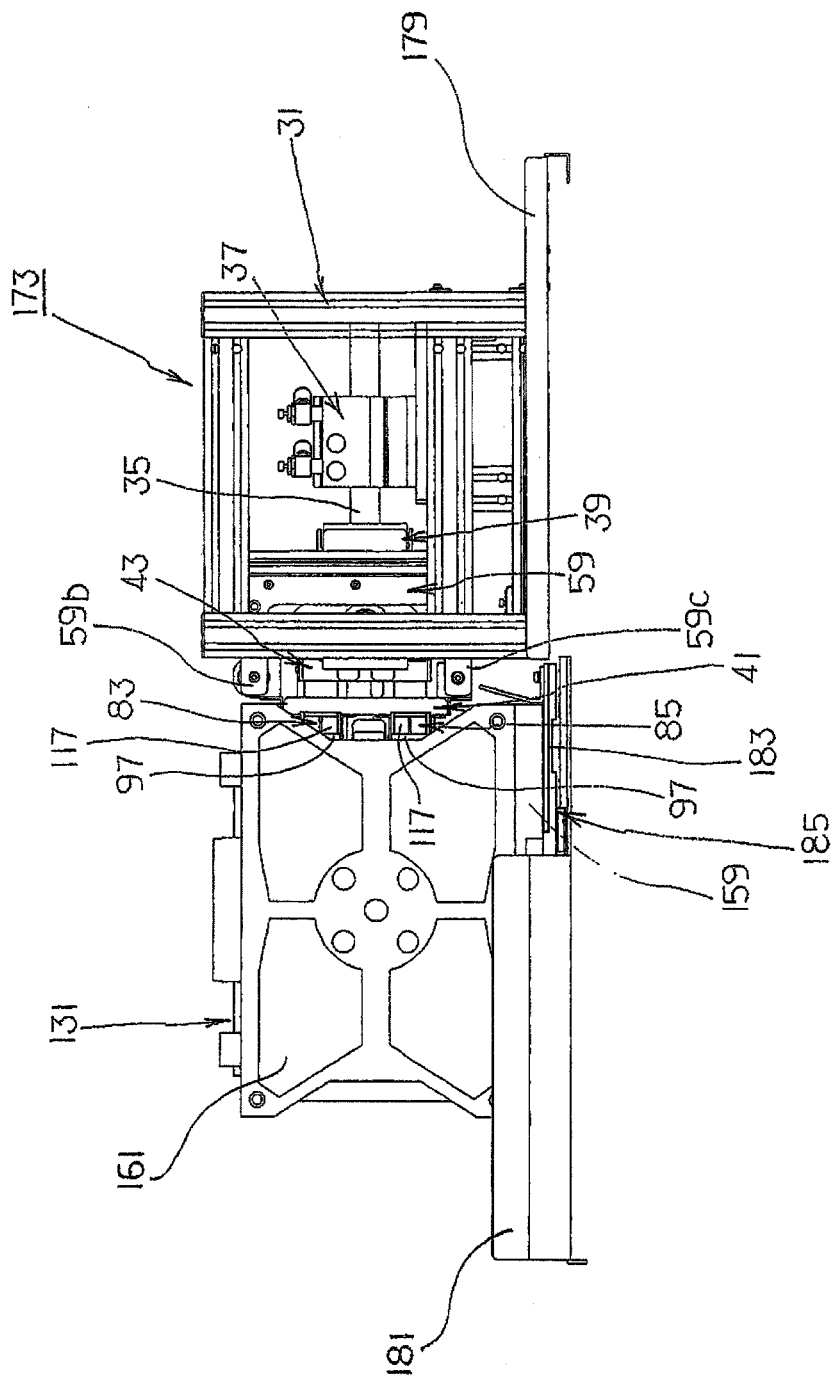
FIG. 22 is a side view of the chuck mechanism whose chuck members are fastening the electrode terminals, and the magazine.
Figure 23:
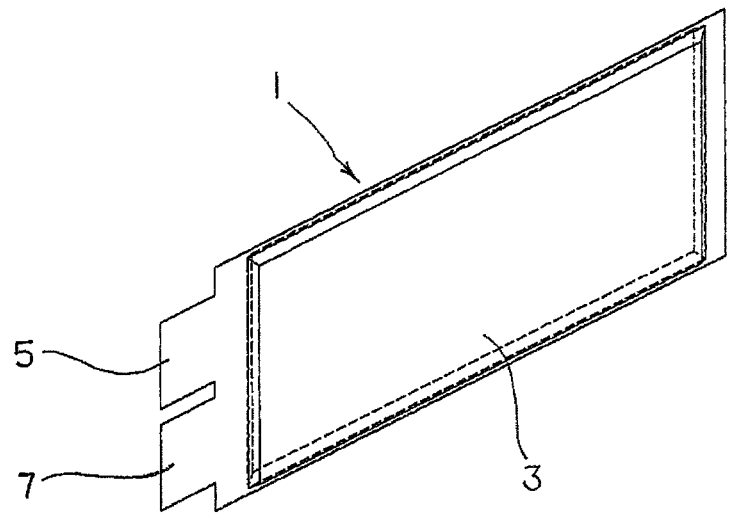
FIG. 23 is a perspective view of a flat-rechargeable battery.
Figure 24:
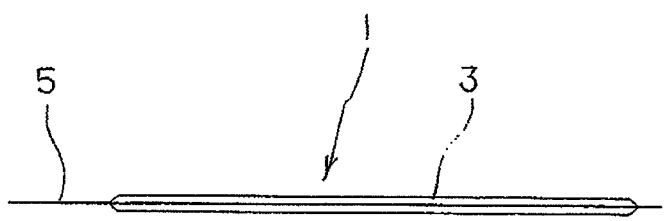
FIG. 24 is a plane view of the flat-rechargeable battery.
Figure 25:
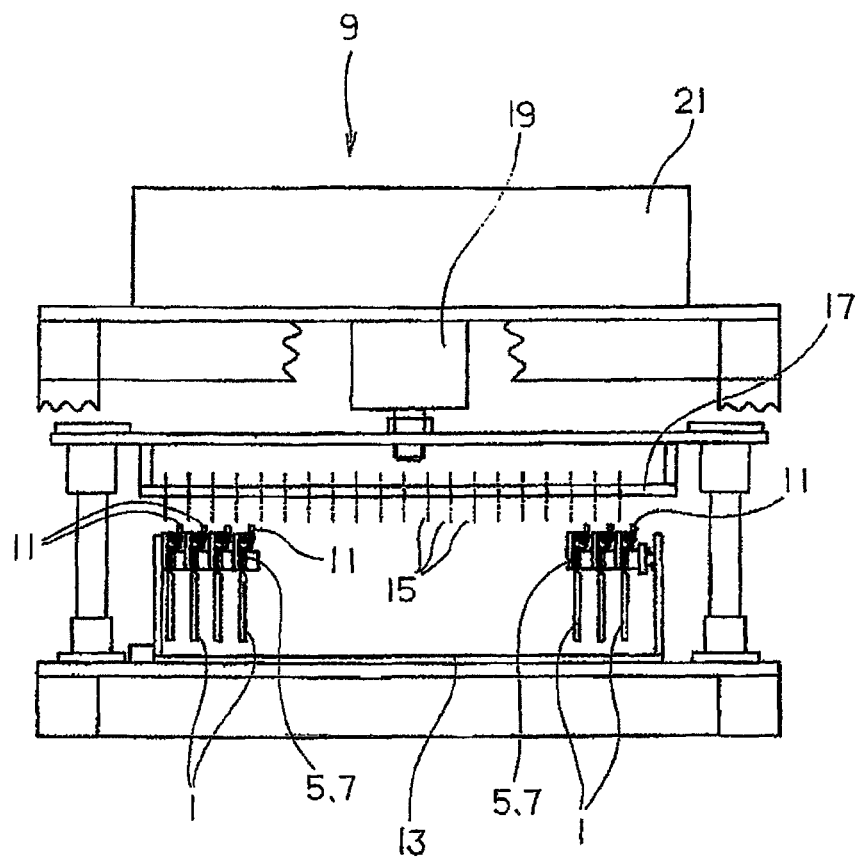
FIG. 25 is a front view of a charge/discharge testing device disclosed in Patent Document 1.

Thereafter, when the electric wires of the charge/discharge testing device are coupled with the rear ends of the metal plates 115, 117 projecting from the rear surfaces of the chuck mounting plates 113 of the divided chuck-retaining members 69 and the air cylinder 37 is driven, the piston rod 35 extends forward, so that the roller-retaining member 41 (the divided roller-retaining members 67) mounted on the piston rod 35 moves forward. Then, when the roller-retaining member 41 thus moves, the metal plates 115, 117, of the chuck members 83, 85, fanning out in a substantially V shape in a plane view are closed by the pairs of rollers 97 as shown in FIG. 21 and FIG. 22, so that the fastening surfaces 125 of the exfoliating/fastening members 121 fixed on the front end sides of the metal plates 115, 117 fasten the upper and lower electrode terminals 5, 7 of the flat-rechargeable batteries 1 from the left and right.

In this embodiment, the plural slits 119 are provided in the front and rear direction in the front end of each of the metal plates 115, 117 to divide the front end sides of the metal plates 115, 117 to small parts, and therefore, even with an assembly error or the like in the metal plates 115, 117, the exfoliating/fastening members 121 of the metal plates 115, 117 surely come into pressure-contact with the surfaces of the electrode terminals 5, 7, so that the spike pins 127 projecting from the fastening surfaces 125 exfoliate the oxide films formed on the surfaces of the electrode terminals 5, 7.

Thereafter, electricity is supplied through the electric wires of the charge/discharge testing device coupled with the rear end sides of the chuck members 83, 85 (the metal plates 115, 117), and the charge/discharge test of the flat-rechargeable batteries 1 each fastened by the chuck members 83, 85 is started.

Then, after the end of the test, when the piston rod 35 of the air cylinder 37 is contracted backward and the roller-retaining member 41 is moved backward, the metal plates 115, 117, of the chuck members 83, 85, closed by the rollers 97 fan out again as shown in FIG. 19.

Thus using the chuck mechanism 173 according to this embodiment at the time of the charge/discharge test of the flat-rechargeable batteries 1 naturally makes it possible to conduct the charge discharge test of a large number of the flat-rechargeable batteries 1 at a time, and also makes it possible to accurately and favorably chuck the electrode terminals 5, 7 by the chuck members 83, 85 while lightening the troublesome works such as the work of coupling a large number of the flat-rechargeable batteries 1 one by one to the group of the clip-type coupling terminals prior to the charge/discharge test as is required in the conventional example of Patent Document 1 and the work of storing a large number of the flat-rechargeable batteries in the battery container, with the electrode terminals being inserted in the insertion holes of the battery container as is required in the conventional example of Patent Document 2.

That is, as described above, in this embodiment, on the magazine 131 side, it is only necessary to fasten the flat-rechargeable batteries 1 in the storage chambers, and thereafter, when the magazine 131 is moved close to the chuck mechanism 173, the fastening arm 139 first fastens the fastened piece 171 of the battery pressing plate 133, so that the chuck width is adjusted, and thereafter, while the positioning pins 177 with the longer length projectingly provided on the left and right divided chuck-retaining members 69 first fasten the fastened pieces 175, the divided chuck-retaining members 69 therebetween are arranged evenly by the spring forces of the coil springs 145 so that their intervals are equally adjusted in sequence, and as a result, chuck accuracy is improved while a work load is lightened.

In addition, it is possible to quickly conduct the charge/discharge test only by carrying the magazine 131 storing a large number of the flat-rechargeable batteries 1 to the front surface of the chuck mechanism 173, and therefore, a place for the charge/discharge test is not limited.

Further, the fanning-out metal plates 115, 117 of the chuck members 83, 85 are closed at a time by using the pairs of rollers 97, which enables a smooth opening/closing operation of the metal plates 115, 117. Further, the plural slits 119 are provided in the front and rear direction in the front ends of the metal plates 115, 117 to divide the front end sides of the metal plates 115, 117 into small parts and the displaced electrode terminals 5, 7 are guided to the fastening surfaces 125 by the guide members 129 of the exfoliating/fastening members 121. This structure has advantages that, even if the metal plates 115, 117 have assembly errors or the like, the electrode terminals 5, 7 can be surely fastened by the metal plates 115, 117 (exfoliating/fastening members 121) and the oxide films on the surfaces of the electrode terminals 5, 7 can be exfoliated favorably by the spike pins 127.

Further, the plural divided roller-retaining members 67 are arranged in parallel in the lateral direction to form the roller-retaining member 41 and the plural divided chuck-retaining members 69 are arranged in parallel in the lateral direction to form the chuck-retaining member 43, which has an advantage of facilitating the change of individual components and maintenance.

Incidentally, in the above-described embodiment, the pairs of two positioning pins 177 being the second guides are formed to become shorter in order from those of the left and right divided chuck-retaining members 69 toward those of the center divided chuck-retaining member 69, but the pairs of two positioning pins 177 may be formed to become shorter in order from those on the side of the width-deciding/fastening member 135 being the first guide toward those on the other support 31$k$ side, and such an embodiment is capable of attaining the desired proposition similarly to the above-described embodiment.

Further, in the above-described embodiment, as the driver moving the roller-retaining member 41 back and forth, the air cylinder 37 is used, but the driver is not limited to the air cylinder, and a motor of any other actuator may be used as the driver.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A chuck mechanism of a charge/discharge testing device for flat-rechargeable batteries comprising:
   a first guide engageable with a battery pressing member of a battery storage which moves according to a battery storage width of a plurality of flat-rechargeable batteries stored in parallel in the battery storage; and
   a plurality of chuck units arranged in parallel by being resiliently and continuously joined and having the first guide on one end side, and
   a second guide mounted on each of the chuck units, wherein
   a chuck width of all of the chuck units resiliently arranged in parallel is adjusted according to the battery storage width of the flat-rechargeable batteries by an engagement of the first guide and the battery pressing member, and
   the second guide positions each of the chuck units being adjusted according to the battery storage width with corresponding flat-rechargeable batteries in the battery storage.

2. The chuck mechanism of the charge/discharge testing device for flat-rechargeable batteries according to claim 1, wherein:
   the second guide is made up of a pair of two positioning pins fastening a positioner that is formed in the battery storage corresponding to each of the chuck units; and
   each pair of the positioning pins becomes shorter in order from both ends toward a center of the plurality of chuck units arranged in parallel.

3. The chuck mechanism of the charge/discharge testing device for flat-rechargeable batteries according to claim 2, wherein:
   the chuck units include
   a roller-retaining member which is movable in a front and rear direction of a support base when a driver mounted on the support base is driven and in which a plurality of divided roller-retaining members are movably arranged in parallel via a shaft extending in a left and right direction of the support base, the divided roller-retaining members arranging in parallel a plurality of pairs of rollers vertically on each front surface of the divided roller-retaining members, and a chuck-retaining member in which a plurality of divided chuck-retaining members each making one unit with each of the divided roller-retaining members are resiliently and movably arranged in parallel via the shaft extending in the left and right direction of the support base;

the divided chuck-retaining members each have a plurality of chuck members each made up of a pair of two strip-formed metal plates inserted through a gap between each of the pairs of rollers, with front end sides of the metal plates fanning out in a V shape in a plane view and with rear end sides of the metal plates coupled with electric wires of the charge/discharge testing device; and the second guide is provided in each of the divided chuck-retaining members.

4. The chuck mechanism of the charge/discharge testing device for flat-rechargeable batteries according to claim 3, wherein an oxide film exfoliating/fastening member having a large number of projections on a fastening surface of the oxide film exfoliating/fastening member is fixed on front ends of a pair of two chuck members.

5. The chuck mechanism of the charge/discharge testing device for flat-rechargeable batteries according to claim 4, wherein the oxide film exfoliating/fastening member has a guide inclining inward from the front end sides of the chuck members toward the fastening surface.

6. The chuck mechanism of the charge/discharge testing device for flat-rechargeable batteries according to claim 4, wherein slits are formed in a front and rear direction in the front ends of the chuck members, and the oxide film exfoliating/fastening member is fixed on each front end of the chuck members demarcated by the slits.

7. The chuck mechanism of the charge/discharge testing device for flat-rechargeable batteries according to claim 1, wherein:

the chuck units include a roller-retaining member which is movable in a front and rear direction of a support base when a driver mounted on the support base is driven and in which a plurality of divided roller-retaining members are movably arranged in parallel via a shaft extending in a left and right direction of the support base, the divided roller-retaining members arranging in parallel a plurality of pairs of rollers vertically on each front surface of the divided roller-retaining members, and a chuck-retaining member in which a plurality of divided chuck-retaining members each making one unit with each of the divided roller-retaining members are resiliently and movably arranged in parallel via the shaft extending in the left and right direction of the support base;

the divided chuck-retaining members each have a plurality of chuck members each made up of a pair of two strip-formed metal plates inserted through a gap between each of the pairs of rollers, with front end sides of the metal plates fanning out in a V shape in a plane view and with rear end sides of the metal plates coupled with electric wires of the charge/discharge testing device; and the second guide is provided in each of the divided chuck-retaining members.

* * * * *